United States Patent
Feldtkeller

(10) Patent No.: US 8,442,128 B2
(45) Date of Patent: May 14, 2013

(54) SIGNAL TRANSMITTING DEVICE AND PHASE MODULATED METHOD FOR TRANSMITTING VIA A SIGNAL TRANSMITTING DEVICE

(75) Inventor: Martin Feldtkeller, Munich (DE)

(73) Assignee: Infineon Technologies AG, Munich (DE)

( * ) Notice: Subject to any disclaimer, the term of this patent is extended or adjusted under 35 U.S.C. 154(b) by 1777 days.

(21) Appl. No.: 11/713,467

(22) Filed: Mar. 2, 2007

(65) Prior Publication Data

US 2007/0274412 A1    Nov. 29, 2007

(30) Foreign Application Priority Data

May 24, 2006 (EP) ...................................... 06010756

(51) Int. Cl.
*H04B 3/00* (2006.01)

(52) U.S. Cl.
USPC ........... 375/258; 375/257; 375/259; 375/295; 375/316; 375/322; 363/25; 363/37

(58) Field of Classification Search .......... 375/219–222, 375/257–259, 295, 316
See application file for complete search history.

(56) References Cited

U.S. PATENT DOCUMENTS

| | | | |
|---|---|---|---|
| 5,235,617 A | | 8/1993 | Mallard, Jr. |
| 5,991,171 A | * | 11/1999 | Cheng ........................ 363/21.03 |
| 6,074,386 A | * | 6/2000 | Goble et al. ..................... 606/34 |
| 6,525,566 B2 | | 2/2003 | Haigh et al. |
| 6,917,531 B2 | * | 7/2005 | Scheel et al. ..................... 363/97 |
| 7,304,867 B2 | * | 12/2007 | Usui ........................... 363/21.06 |
| 7,394,209 B2 | * | 7/2008 | Lin et al. ........................ 315/247 |
| 7,429,853 B2 | * | 9/2008 | Zhang et al. .................. 323/305 |
| 7,560,872 B2 | * | 7/2009 | Lyle et al. ...................... 315/220 |
| 7,596,007 B2 | * | 9/2009 | Phadke et al. .................. 363/71 |
| 7,745,970 B2 | * | 6/2010 | Radecker et al. ........ 310/316.01 |
| 7,782,633 B2 | * | 8/2010 | Yamauchi et al. ......... 363/21.02 |
| 8,154,891 B1 | * | 4/2012 | Morico et al. .................. 363/61 |
| 2006/0131960 A1 | * | 6/2006 | Aritsuka ........................ 307/17 |
| 2006/0229046 A1 | * | 10/2006 | Bult et al. .................. 455/252.1 |
| 2007/0008757 A1 | * | 1/2007 | Usui et al. ..................... 363/125 |
| 2007/0171684 A1 | * | 7/2007 | Fukumoto .................. 363/21.09 |
| 2009/0021966 A1 | * | 1/2009 | Jacobson et al. ............... 363/52 |
| 2009/0251925 A1 | * | 10/2009 | Usui et al. ...................... 363/16 |
| 2010/0182127 A1 | * | 7/2010 | Beigel et al. ................. 340/10.1 |

FOREIGN PATENT DOCUMENTS

| | | |
|---|---|---|
| DE | 1052447 | 3/1959 |
| DE | 10100282 A1 | 7/2002 |
| DE | 10232642 A1 | 2/2004 |
| WO | WO 2005025043 A1 * | 3/2005 |

* cited by examiner

*Primary Examiner* — Hirdepal Singh
(74) *Attorney, Agent, or Firm* — Maginot, Moore & Beck LLP

(57) ABSTRACT

A signal transmitting device and a method for transmitting via a signal transmitting device is disclosed. In one embodiment the transmitting device comprises a first resonant circuit with a resonant circuit inductance and a resonant circuit capacitance and a second resonant circuit with a resonant circuit inductance and a resonant circuit capacitance, a coupling element which couples the first resonant circuit to the second resonant circuit, a first excitation circuit, coupled to the first resonant circuit, and at least one further excitation circuit coupled to the second resonant circuit.

25 Claims, 14 Drawing Sheets

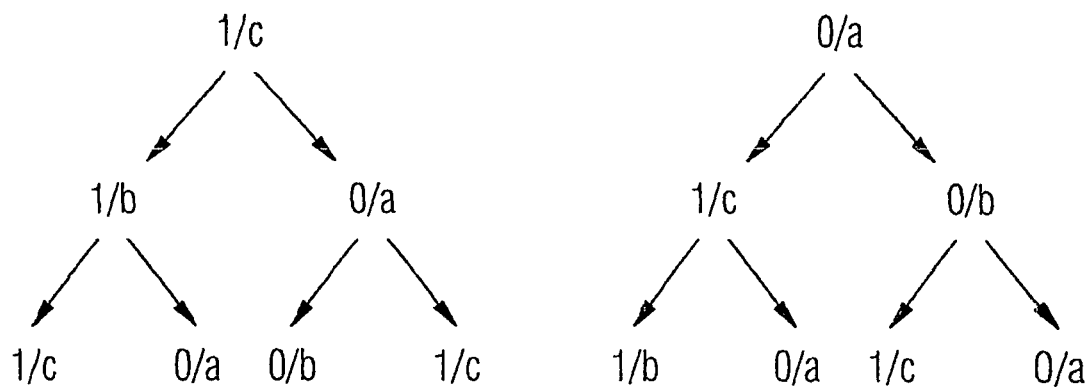

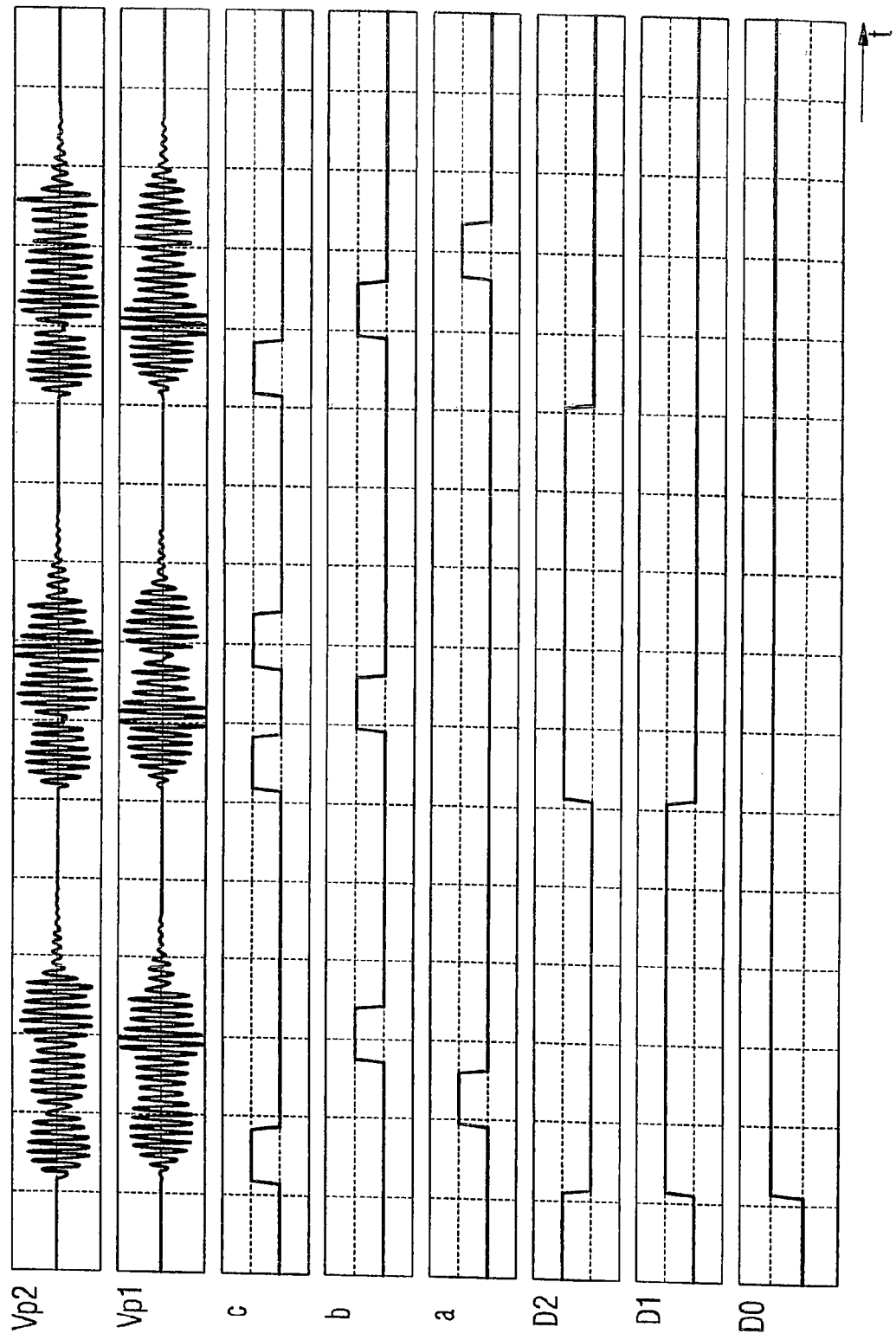

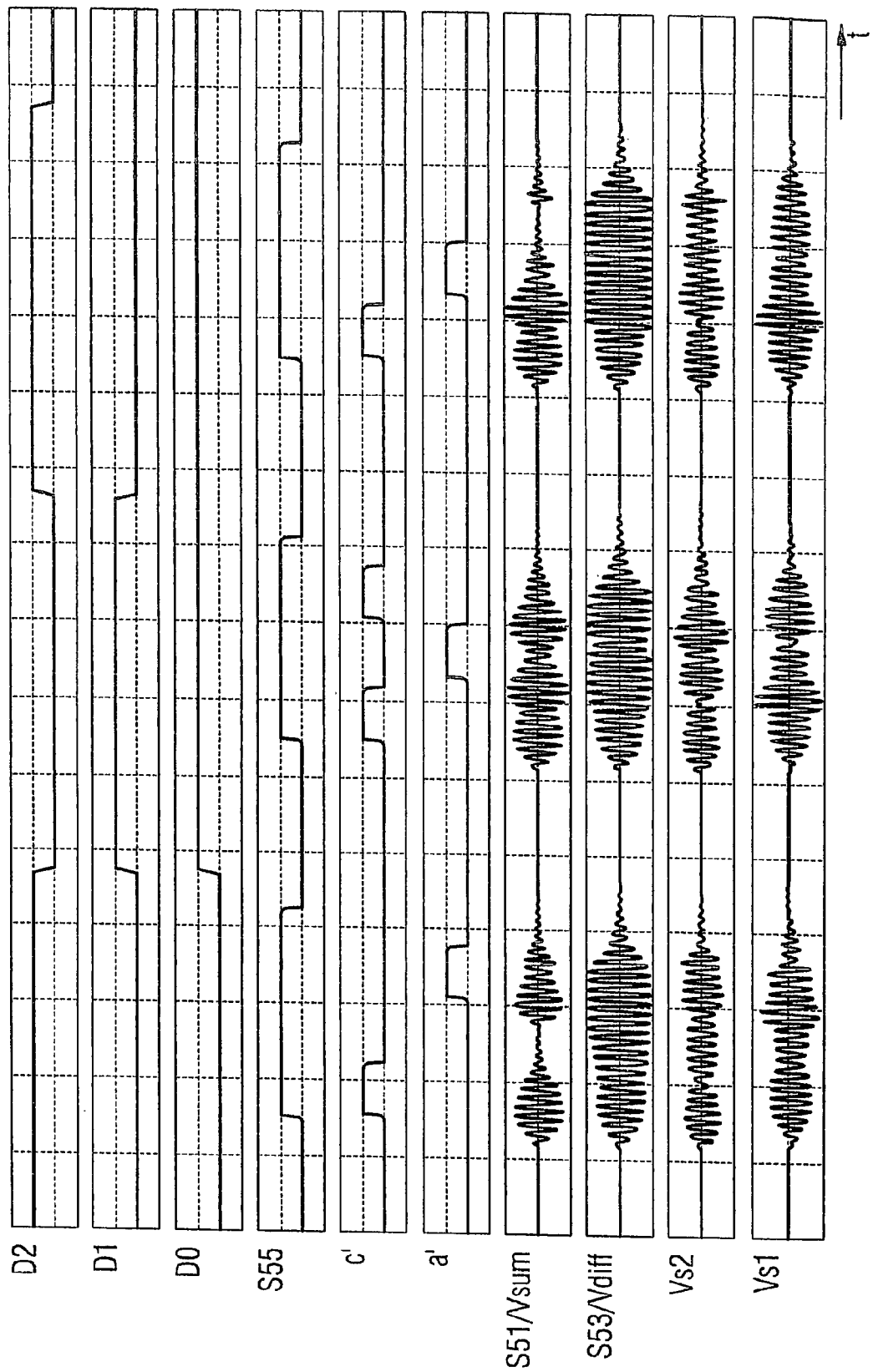

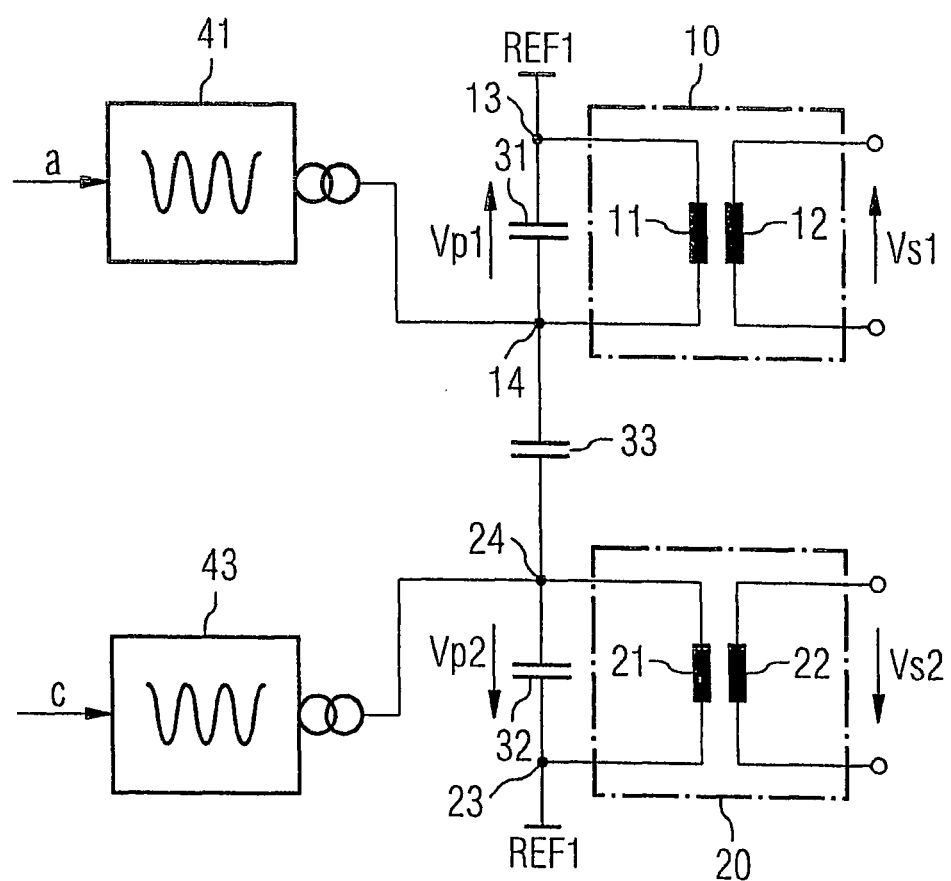

SIGNAL TRANSMITTING DEVICE AND PHASE MODULATED METHOD FOR TRANSMITTING VIA A SIGNAL TRANSMITTING DEVICE

FIELD OF TECHNOLOGY

Embodiments of the present invention relate to a signal transmitting device and to a method for transmitting signals via such transmitting device.

SUMMARY

A signal transmitting device and method is provided.

BRIEF DESCRIPTION OF THE DRAWINGS

Embodiments of the present invention will be apparent to one skilled in the art upon examination of the detailed description of embodiments of the invention.

In the drawings

FIG. 12 illustrates a possible method for transmitting a two-valued data signal via the signal transmitting device according to the invention;

FIG. 13 illustrates a coding arrangement for the method explained in FIG. 12;

FIG. 14 shows a method for serially transmitting three data signals which are in each case two-valued, and the signals occurring on the primary side of the signal transformer with this method;

FIG. 16 illustrates the signals occurring on the secondary side of the signal transformer in the method according to FIG. 14;

FIG. 17 shows a further example of a signal transformer according to the invention.

DETAILED DESCRIPTION OF THE DRAWINGS

In the figures, identical reference symbols designate identical circuit components and signals having the same meaning unless otherwise specified.

Figure 1:
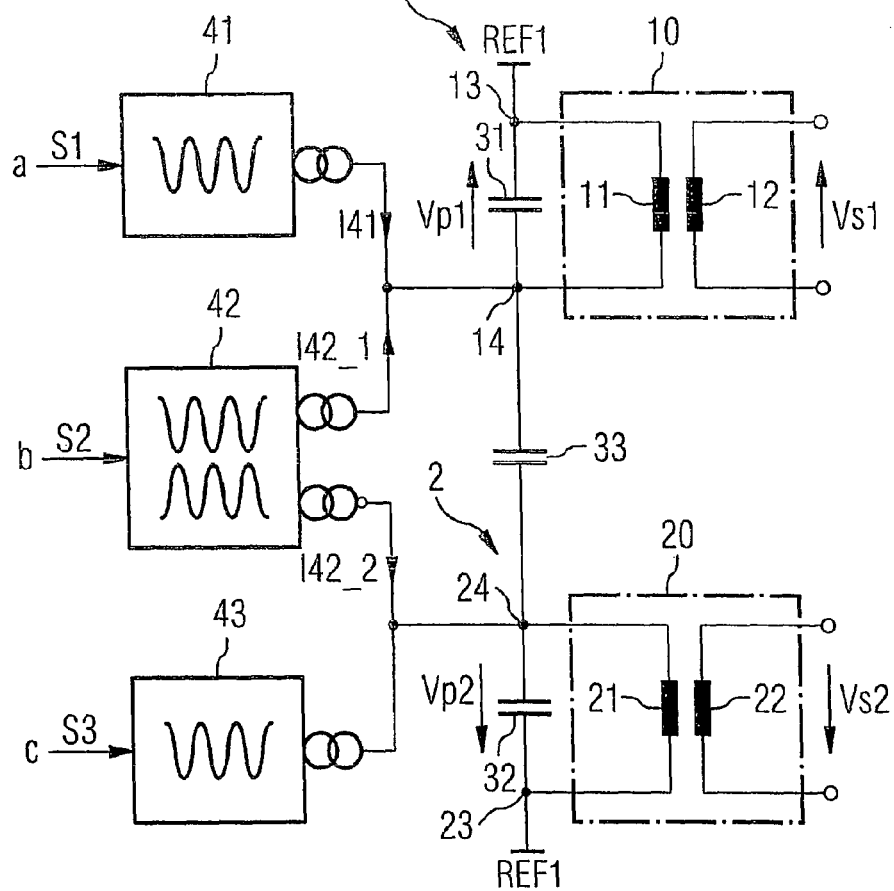
FIG. 1 shows an example of a signal transmitting device according to an embodiments of the invention which has two transformers with one primary winding and one secondary winding each and has two resonant circuits and in which the resonant circuits are implemented on the primary side and can be excited by excitation circuits.

FIG. 1 shows an example of a signal transformer according to the invention. This signal transformer comprises two transformers 10, 20 which in each case have a primary winding 11, 21 and a secondary winding 12, 22 coupled inductively to the primary winding 11, 21. These transformers are implemented, for example as "coreless transformers", that is to say they have no transformer core magnifying the inductive coupling between the primary windings 11, 21 and the secondary windings 12, 22. Coreless transformers as known in the art may be used.

The signal transmitting device also comprises two resonant circuits 1, 2 with one resonant circuit inductance and one resonant circuit capacitance 31, 32 each. In the example shown, these resonant circuits are arranged on the primary side, i.e. on the side of the primary windings 11, 21 and have the primary windings 11, 21 as resonant circuit inductances. These resonant circuits 1, 2 are constructed as parallel resonant circuits in the example and implemented by connecting a first capacitive storage element 31 in parallel with the primary winding 11 of the first transformer 10 as first resonant circuit capacitance and a second capacitive storage element 32 as second resonant circuit capacitance in parallel with the primary winding 21 of the second transformer 20. These capacitive storage elements 31, 32 are, for example capacitors.

A first connection 13 of the first resonant circuit 1 is formed by a first circuit node common to the primary winding 11 and to the capacitive storage element 31, and a second connection 14 of this first resonant circuit 1 is formed by a second circuit node common to the primary winding 11 and the capacitive storage element 31. Correspondingly, a first connection 23 of the second resonant circuit 2 is formed by a first circuit node common to the primary winding 21 and the second capacitive storage element 32. A second connection 24 of this second resonant circuit 2 is formed by a second circuit node common to the primary winding 21 and the capacitive storage element 32. In the example, the first connections 13, 23 of the resonant circuit are in each case connected to a terminal for a reference potential REF1 on the primary side. This reference potential can be any potential but particularly a supply potential.

In the signal transmitting device shown, the two resonant circuits 1, 2 are coupled to one another in such a manner that when one resonant circuit is excited into an oscillation, the other resonant circuit is excited into an oscillation at the same time. To couple the two resonant circuits 1, 2, a coupling element 33 is present which is connected between the two connections 14, 24 of the two resonant circuits 1, 2. In the example, this coupling element 33 is implemented in the form of a capacitive storage element and particularly a capacitor. However, any other coupling element can be provided which is suitable for producing an excitation of the other resonant circuit in each case into a phase-shifted oscillation when one of the two resonant circuits is excited into an oscillation. In particular, an inductive coupling element could also be provided as coupling element.

The two resonant circuits according to FIG. 1 are directly coupled to one another in that the coupling element 33 is connected between the resonant circuit inductances 11, 21 of the two resonant circuits 1, 2. As an alternative, the possibility exists to couple the two resonant circuits indirectly via the secondary windings 12, 22 of the transformers 10, 20. The coupling element is then connected between the secondary windings in a manner not shown in greater detail.

For exciting the two resonant circuits 1, 2, the signal transmitting circuit of FIG. 1 comprises three excitation circuits 41, 42, 43 which excite the resonant circuits into oscillations in each case in dependence on a control signal S1, S2, S3. For the further explanation, it is assumed that these control signals S1, S2, S3 are in each case two-valued signals which can assume a first or a second signal level. This also assumes that the excitation circuits 41, 42, 43 are activated for exciting the resonant circuits at a first level of the control signal S1, S2, S3 supplied to them in each case and that the excitation circuits are deactivated at a second level of the control signal supplied to them in each case.

A first one 41 of the excitation circuits is supplied with a first one S1 of the control signals at a control input. This first excitation circuit 41 is constructed for exciting the first resonant circuit 11, 31 into an oscillation in dependence on this control signal S1. In the activated state, this first excitation circuit 41 supplies an excitation current I41 with periodically alternating current direction or at least periodically varying current intensity to the first resonant circuit 1. The frequency with which the current direction or current intensity changes is dependent on the resonant frequency of the resonant circuit 1. The excitation current can have a rectangular current variation.

For exciting the first resonant circuit 1, the output of the first excitation circuit 41 is connected to the second connection 14 of this first resonant circuit 1 in the example shown.

Via the coupling element 33, the output of the first excitation circuit 41 is also connected to the second connection 24 of the second resonant circuit 2 as a result of which the second resonant circuit 2 is excited at the same time as the first resonant circuit 1 is excited.

A second one 42 of the excitation circuits is supplied with a second one S2 of the control signals at a control input. This second excitation circuit 42 is constructed for exciting the first resonant circuit into an oscillation as determined via the second control signal S2 and, at the same time, for exciting the second resonant circuit into an oscillation which is phase-shifted with respect to the oscillation of the first resonant circuit. For this purpose, the second excitation circuit 42 comprises two outputs, a first output of which is connected to the second connection 14 of the first resonant circuit 1 and a second output of which is connected to the second connection 24 of the second resonant circuit 2.

In the activated state, the second excitation circuit 42 supplies a first excitation current I42_1 with a periodically alternating current direction or at least a periodically varying current intensity to the first resonant circuit 1 and a second excitation current I42_2 with a periodically alternating current direction or at least a periodically varying current intensity to the second resonant circuit 2. The frequencies with which the current directions of the excitation currents I42_1, I42_2 or the current intensities change are dependent on the resonant frequencies of the first and second resonant circuits. These resonant circuits may be dimensioned in such a manner that these resonant frequencies are at least approximately equal.

The signal variations of the first and second excitation current I41_1, I42_2 are phase-shifted with respect to one another. The phase shift between these excitation currents I41_1, I42_2 determines the phase shift between the oscillations of the first and second resonant circuit 1, 2.

A third one of the excitation circuits 43 is supplied with a third control signal S3 at a control input. This third excitation circuit 43 is constructed for exciting the second resonant circuit into an oscillation as determined by this third control signal S3. In the activated state, this third excitation circuit 43 supplies an excitation current I43 with periodically alternating current direction or at least a periodically varying current intensity to the second resonant circuit 2. The frequency with which the current direction or the current intensity changes is dependent on the resonant frequency of the second resonant circuit 2.

For exciting the second resonant circuit 2, the output of the third excitation circuit 43 is connected to the second connection 24 of this second resonant circuit 2 in the example shown.

Via the coupling element 33, the output of the third excitation circuit 43 is also connected to the second connection 14 of the first resonant circuit 1 as a result of which the first resonant circuit 1 is also excited at the same time as the second resonant circuit 2 is excited.

The resonant frequencies of the two resonant circuits 1, 2 are dependent on the component characteristics of the primary windings 11, 21 and of the capacitive storage elements 31, 32. These components are may be selected in such a manner that the resonant frequencies of the two resonant circuits are at least approximately equal. This resonant frequency can be selected in such a manner that it is up to several hundred MHz.

For the previous explanation, it has been assumed that the excitation currents supplied to the resonant circuits 1, 2 by the excitation circuits 41, 42, 43 change their current direction periodically. In a manner not shown in greater detail, an identical effect with regard to the excitation of the resonant circuits 1, 2 can also be achieved by the excitation circuits providing currents flowing only in one direction at their outputs but with the current intensity alternating periodically between a high and a low value.

To transmit signals, the signal transmitting device explained is operated in such a manner that in each case only one of the excitation circuits 41, 42, 43 is activated driven by the respective control signal S1, S2, S3 at one point in time.

The signal transformer shown in FIG. 1 can be used for transmitting three mutually distinguishable useful information items in dependence on which one of the three excitation circuits 41, 42, 43 is activated. These useful information items are called transmit symbols a, b, c in the text which follows. Each one of these transmit symbols is allocated to one of the control signals S1, S2, S3 in the manner shown in the FIG. One of these transmit symbols, for example, the transmit symbol a, is transmitted when the associated control signal, for example, the first control signal S1, has a level at which the excitation circuit to which the control signal is supplied is activated.

In the signal transformer explained, the information to be transmitted is contained in the phase relation between an oscillation signal of the first resonant circuit 1 and an oscillation signal of the second resonant circuit 2. The oscillation signal is both a voltage across the resonant circuits 1, 2 and a current flowing in the resonant circuits 1, 2.

For the explanation following, the voltages across the resonant circuits 1, 2 are considered which correspond to voltages across the primary windings 11, 21 in the parallel resonant circuits shown. If the resonant circuits 1 and 2 on the primary side in the signal transformer are excited into oscillations, a sinusoidal signal variation of the voltages Vp1, Vp2 across the primary windings 11, 22 is obtained. These primary voltages Vp1, Vp2 induce secondary voltages Vs1, Vs2 in the secondary windings 12, 22 of the transformers 10, 20. These secondary voltages Vs1, Vs2 have a sinusoidal variation corresponding to the variation of the primary voltage Vp1, Vp2 and the signal variation of a secondary voltage Vs1, Vs2 can be phase-shifted with respect to the signal variation of the associated primary voltage Vp1, Vp2. However, the phase relation between the primary voltages Vp1, Vp2 is transferred to the secondary voltages Vs1, Vs2. At a given phase shift between the first primary voltage Vp1 and the second primary voltage Vp2, the first secondary voltage Vs1 and the second secondary voltage Vs2 are thus phase-shifted with respect to one another by the same phase shift.

Transmitting three different information symbols requires exciting the two resonant circuits in such a manner that three mutually clearly distinguishable phase relations between the oscillation of the first resonant circuit 1 and the oscillation of the second resonant circuit 2 are produced. For this purpose, phase shifts between the oscillation of the first and second resonant circuit 1, 2 are, for example 90°, 180° and 270°.

For the explanation following, to determine the phase shifts or phase differences, the phase of the oscillation of the second resonant circuit 2 with respect to the phase of the oscillation of the first resonant circuit is considered. A positive phase difference is present when the phase of the second oscillation leaves the phase of the first oscillation.

Figure 2:
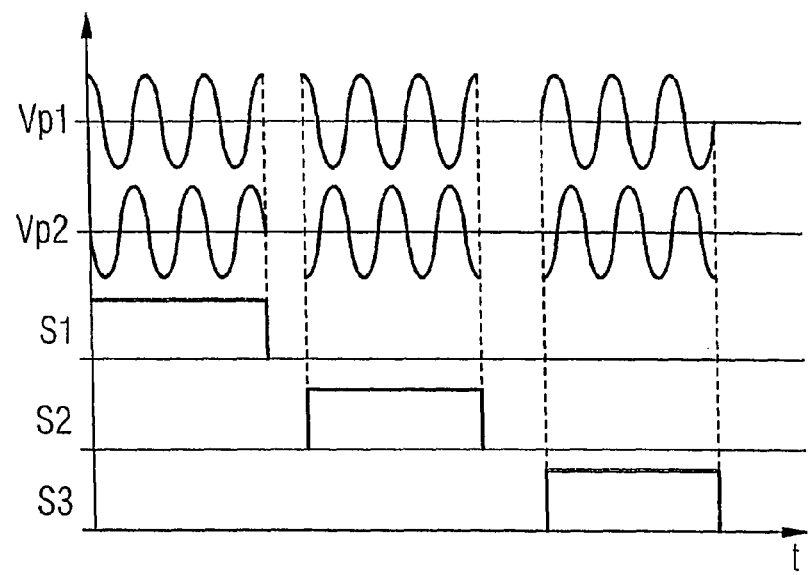
FIG. 2 shows voltages at the primary windings of the transformers when the resonant circuits are excited by the excitation circuits, without considering settling processes.

If the first resonant circuit 1 in the signal transmitting device shown is excited into an oscillation by the first excitation circuit 41, the second resonant circuit 2 is also excited into an oscillation due to the capacitive coupling of the output of the first excitation circuit 41 to the second resonant circuit 2. The capacitive coupling produces a phase shift of +90° or, respectively, −270° between these two oscillations so that the oscillation of the second resonant circuit 21, 32 leads that of the first resonant circuit 11, 31 by 90° or lags behind it by 270°. This is illustrated in FIG. 2 in which the variations of the first and second oscillation are shown for an excitation of the first excitation circuit 41. The activation of the first excitation circuit 41 is shown by a High level of the first control signal S1 in FIG. 2.

For reasons of clarity, settling processes, during which the amplitude of the respective voltage Vp1, Vp2 is only rising, are not taken into consideration in the variations with time in FIG. 2.

Figure 3A:
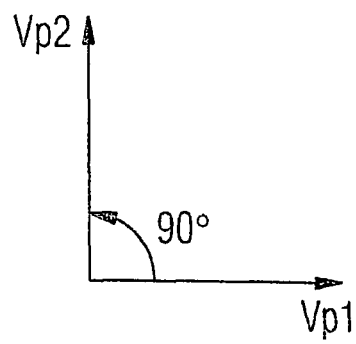
FIG. 3 illustrates phase relations of oscillations of the resonant circuits of the signal transformer for various operating states by means of complex vector diagrams.

The phase relation between the oscillatory first and second primary voltages Vp1, Vp2 for the case of an activation of the first excitation circuit 41 is also shown in the form of a complex vector diagram in FIG. 3a. In FIG. 3a, Vp1, Vp2 are complex vectors of the primary voltages. The complex vector of the second primary voltage Vp2 leads the complex vector of the first primary voltage Vp1 by 90°.

Figure 3B:
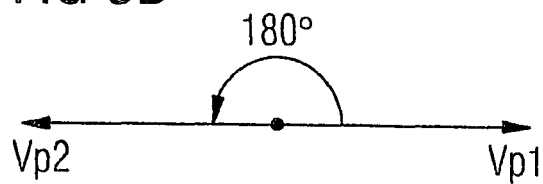
Figure 3C:
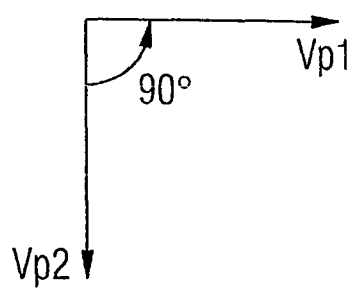

In the case of an excitation of the second excitation circuit 42, driven by the second control signal S2, the two resonant circuits are excited into oscillations, the phase relation of which is given by the phase relation of the excitation signals I42_1, I42_2. These excitation currents are in antiphase to one another, for example, i.e. phase-shifted by 180° with respect to one another. As a result, the first and second primary voltages Vp1, Vp2, are phase-shifted by 180° with respect to one another as shown in FIG. 2 for a High level of the second control signal S2 and in the complex vector diagram in FIG. 3B.

When the second resonant circuit 21, 32 is excited by the third excitation circuit 43 under control of the third control signal S3, the first resonant circuit 11, 31 is also excited due to the capacitive coupling of the two resonant circuits. The signal variation of the first primary voltage Vp1, in this case leads the signal variation of the second primary voltage Vp2 by 90° or lags behind it by 270°, respectively. This is equivalent to the phase of the oscillation of the second resonant circuit 2 lagging behind the phase of the oscillation of the first resonant circuit 1 by 90° or leading it by 270°, respectively. The phase shift is thus −90° or +270°, respectively.

As an alternative or in addition to the second excitation circuit, there can also be a fourth excitation circuit which excites both resonant circuits in the same phase. However, in-phase excitations could also be produced by electromagnetic interference in the transformers which would then not be distinguishable from a genuine in-phase excitation on the secondary side. The in-phase excitation for transmitting signals is omitted, therefore.

Thus, the signal transmitting device shown can be used for adjusting three different phase relations between the primary voltages Vp1, Vp2 and thus also between the secondary voltages Vs1, Vs2 of the transformer. Depending on which excitation circuit 41, 42, 43 is activated, i.e. which of the transmit symbols a, b, c is to be transmitted, the phase relation between the primary voltages Vp1, Vp2 is +90° (=−270°), −90° (=+270°) or 180° and correspondingly also +90°, −90° or 180° between the secondary voltages.

Vp1 (ωt) designates the primary voltage of the excited first resonant circuit 1 which changes periodically with time. ω is the resonant frequency of the resonant circuit 1 and t is the time. Correspondingly, Vp2 (ωt) subsequently designates the primary voltage of the excited second resonant circuit 2 which changes periodically with time.

The phase relations explained above can be represented as follows, using Vp1 (ωt) and Vp2 (ωt):

When the first transmit symbol a is transmitted, i.e. when the first excitation circuit 41 is activated, the following applies:

$$Vp1(\omega t)=Vp2(\omega t-90°) \tag{1a}$$

$$Vs1(\omega t)=Vs2(\omega t-90°) \tag{1b}$$

The second primary voltage Vp2 and the second secondary voltage Vs2, respectively thus lead the first primary voltage Vp1 and the first secondary voltage Vs1 by 90° and the phase shift is thus +90°.

When the second transmit symbol b is transmitted, the following applies:

$$Vp1(\omega t)=Vp2(\omega t\pm180°) \tag{2a}$$

$$Vs1(\omega t)=Vs2(\omega t\pm180°) \tag{2b}$$

The primary voltages Vp1, Vp2 and the secondary voltages Vs1, Vs2, are thus in each case phase-shifted with respect to one another by 180°.

The following applies for the transmission of the third transmit symbol:

$$Vp1(\omega t)=Vp2(\omega t+90°) \tag{3a}$$

$$Vs1(\omega t)=Vs2(\omega t+90°) \tag{3b}$$

The second primary voltage Vp2 and the second secondary voltage Vs2, respectively, thus lag behind the first primary voltage Vp1 and the first secondary voltage Vs1 by 90° and the phase shift is thus −90°.

Figure 4:
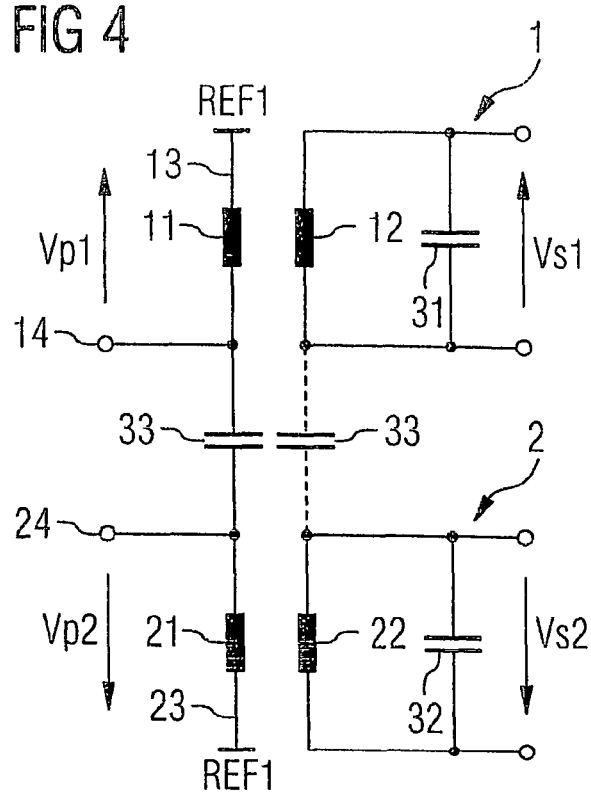
FIG. 4 shows an example of a signal transformer in which the resonant circuits are implemented on the secondary side.

Referring to FIG. 4, as an alternative to the example shown in FIG. 1 in which the resonant circuits are arranged on the primary side, the resonant circuits may be implemented on the secondary side. The resonant circuits according to FIG. 4 are implemented as parallel resonant circuits, the resonant circuit inductances of which are formed by the secondary windings 12, 22. In this arrangement resonant circuit capacitances in the form of capacitive storage elements 31, 32, for example capacitors, are connected in each case in parallel with the secondary windings. The resonant circuits 1, 2 according to FIG. 4 are indirectly coupled via the primary windings 11, 21 of the transformers in that the coupling element 33 is connected between these primary windings 11, 21. As an alternative, it is possible to couple the two resonant circuits 1, 2 directly to one another by connecting the coupling element between the resonant circuits on the secondary side which is shown dashed in FIG. 4. As in the case of the signal transformer according to FIG. 1, the connections 14, 24 of the signal transformer according to FIG. 4 are used for connecting the excitation circuits (not shown).

In the signal transformer according to FIG. 1, the excitation circuits are connected directly to the resonant circuits 1, 2, implemented on the primary side and these resonant circuits are thus excited directly by the excitation circuits.

Figure 5:
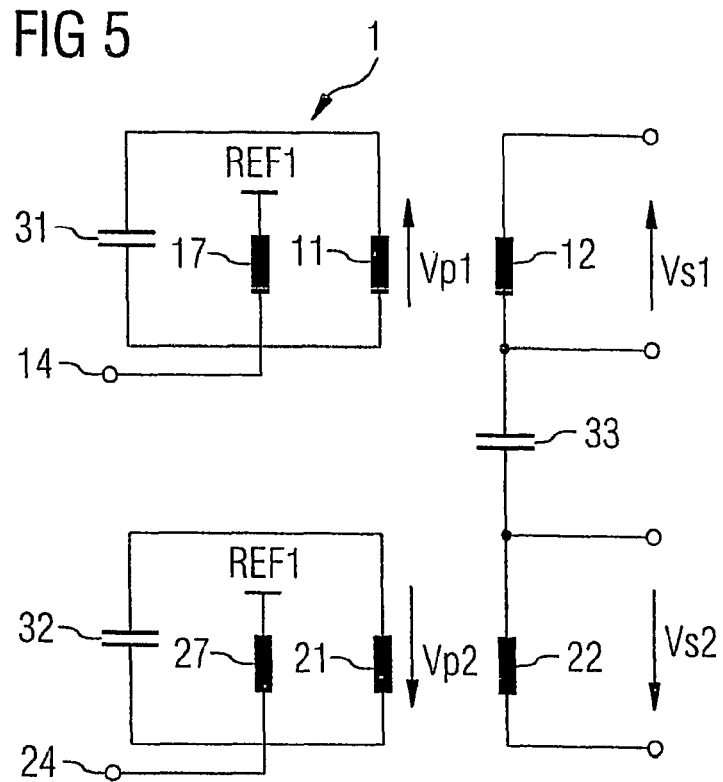
FIG. 5 shows an example of a signal transformer in which the resonant circuits are implemented on the primary side and in which the excitation circuits are inductively coupled to the resonant circuits.

In the signal transformer according to FIG. 4, the resonant circuits 1, 2 implemented on the secondary side are excited indirectly via the primary windings 11, 21 of the transformers the excitation circuits which can be connected to the connections 14, 24. FIG. 5 shows an example of a signal transformer with resonant circuits 1, 2 arranged on the primary side which in each case contain the primary windings of the transformers as resonant circuit inductances and which are indirectly excited. To excite these resonant circuits 1, 2 there are excitation windings 17, 27 one of which is in each case coupled inductively to a primary winding 11, 21—and thus also inductively to a secondary winding 12, 22. One of the excitation windings 17, 27 each is connected between the terminal for the reference potential REF1 on the primary side and one of the connections 14, 24 for the excitation circuits (not shown).

Instead of the parallel resonant circuits of the signal transformers, previously explained by means of FIGS. 1, 4 and 5, series resonant circuits can also be used, which are obtained by connecting the resonant circuit capacitances not in parallel but in series with the resonant circuit inductances.

Figure 6:
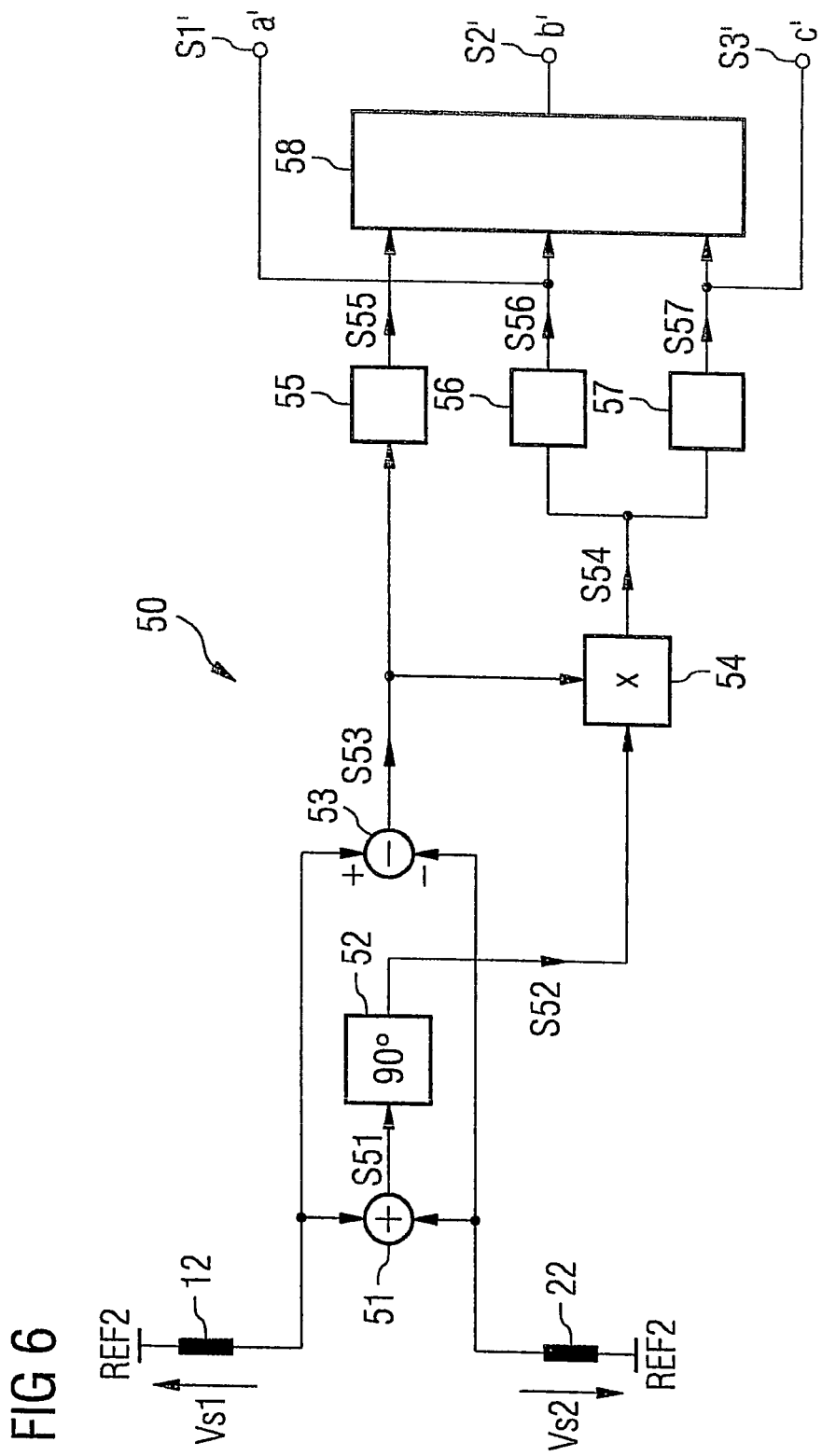
FIG. 6 shows an example of a receiving circuit coupled to the secondary windings of the transformers.

A receiving circuit or demodulation circuit 50 for determining the phase relation between the first secondary voltage Vs1 present at the first secondary winding 12 and the second secondary voltage Vs2 present at the second secondary winding 22 is shown in FIG. 6. These secondary voltages are called first and second received signals in the text which follows. For the sake of better understanding, FIG. 6 only shows the secondary windings 12, 22 of the signal transformer which can be one of the signal transformers previously explained by means of FIGS. 1, 4 and 5. The demodulation circuit 50 has an addition element 51 and a subtraction element 53 which is supplied in each case with the first and second received signals Vs1, Vs2. The subtractor 53 is supplied with the first received signal Vs1 with positive sign and the second received signal Vs2 with negative sign. At the output of the adder 51a sum signal S51 is available which corresponds to the sum of the first and second received signals 12, 22. In the context of the present invention, the adder 51 is understood to be any arrangement which is suitable for adding the two received signals 12, 22. An addition can also be understood to be a weighted addition of the two received signals Vs1, Vs2 with different weighting factors.

The subtractor 53 is understood to be any arrangement which is suitable for subtracting the second signal Vs2 from the first signal Vs1. A subtraction can also be understood to be a weighted subtraction of the two received signals Vs1, Vs2 with different weighting factors.

A phase shifter 52 is connected downstream to the adder 51 and generates from the sum signal S51 at the output of the adder 51 a phase-shifted signal S53, the phase of which is shifted by a predetermined value with respect to the phase of the sum signal S51. The phase shift produced by this phase shifter 52 is ideally 90° for the demodulation circuit shown. In principle, however, this phase shift can be within the range of between 60° and 120°.

The difference signal S53 and the phase-shifted sum signal S52 are supplied to a mixer 54, at the output of which a mixed signal S54 is available. The mixer 54 is followed by an evaluating circuit 55-58 which is arranged for generating from the mixed signal S54 demodulated signals S1', S2', S3', taking into consideration the difference signal S53. In the case of an interference-free transmission, the first demodulation signal S1' corresponds to the first control signal S1, the second demodulation signal S2' corresponds to the second control signal S2 and the third demodulation signal S3' corresponds to the third control signal. In FIG. 6, a', b', c' are received symbols which are allocated to one each of the received signals S1', S2', S3' and which correspond to the transmit symbols a, b, c in the case of an interference-free transmission.

Depending on the phase shift of the first and second received signals Vs1, Vs2, and thus depending on the transmit symbol a, b, c transmitted, different mixed signals S54, which are evaluated by the downstream evaluating circuit 55-58, are available at the output of the mixer 54 in the demodulator 50 shown in FIG. 6.

It can be shown that independently of the phase shift between the first and second received signal Vs1, Vs2, assuming an identical frequency of these first and second received signals Vs1, Vs2, the sum signal S51 and the difference signal S53 are of equal frequency but with different phase. Correspondingly, the difference signal 53 and the phase-shifted sum signal S52 have different phases. It can also be shown that in the case of a phase shift of 90° between the first and second signal Vs1, Vs2, that is to say when the phase of the second signal Vs2 leads the phase of the first signal Vs1 by 90°, the difference signal S53 and the phase-shifted sum signal S52 are oppositely phased signals, whereas in the case of a phase shift of 270° or −90°, respectively, between the first and second signal Vs1, Vs2, the difference signal S53 and the phase-shifted sum signal S52 are in-phase signals. The output signal S54 of the mixer 54 in the case of a phase shift of 90° thus differs in sign from the output signal S54 of the mixer 54 with a phase shift of 270°. A first threshold detector 56 following the mixer 54 compares the mixed signal S54 with a predetermined negative threshold value whereas a second threshold detector 57 following the mixer 54 compares the mixed signal S54 with a predetermined positive threshold value. If the mixed signal S54 is below the negative threshold value, a phase shift of 90° between the first and second signal Vs1, Vs2, i.e. a transmitted information symbol a, is assumed. In this case, a signal level pointing to a transmit symbol a transmitted is present for the first demodulation signal a' at the output of the first threshold detector 56. This signal level is, for example, a High level.

If the mixed signal S54 is above the positive threshold, a phase shift of 270° between the first and second signal Vs1, Vs2 and thus a transmitted information symbol c, is assumed. A level pointing to the transmit symbol c is then present for the third demodulation signal c' at the output of the second threshold detector 57.

In the case of a phase shift of 180° between the first and second signal Vs1, Vs2, the sum signal S51, and thus also the phase-shifted signal S52 is equal to zero. The mixed signal S54 is correspondingly also equal to zero. Such a phase shift of 180° between the first and second signal Vs1, Vs2 is detected by using the difference signal S53. A signal detector 55 supplied with this difference signal S53 detects whether the amplitude of the difference signal S53 is not equal to zero.

The output signal of this signal detector 55 and the output signals of the two threshold detectors 56, 57 are supplied to a logic unit 58, at the output of which the second demodulation signal b' is available. The logic unit is implemented in such a manner that the demodulation signal S2 or the received symbol b', respectively assumes a High level when the signal detector 55 detects an amplitude of the difference signal S53 not equal to zero but when the mixed signal S54 does not exceed the positive threshold value and does not drop below the negative threshold value.

Thus, an exclusion criterion is used for determining the second demodulation signal b'. A phase shift of 180° between the first and second received signal Vs1, Vs2 is thus used as a basis when the difference signal S53 has an amplitude not equal to zero but when the output signals of first and second threshold detector 56, 57 do not point to a phase shift of +90° or −90°. Assuming that the output signal S55 of the signal detector 55 assumes a High level when the amplitude of the difference signal S53 is not equal to zero, that the output signal S56 of the first threshold detector 56 assumes a High level when the mixed signal S54 is below the negative threshold value and that the output signal S57 of the second threshold detector 57 assumes a High level when the mixed signal S54 is above the positive threshold value, the following applies for the received symbols a', b', c': and second signal Vs1, Vs2, the sum signal S51, and thus also the phase-shifted signal S52 is equal to zero. The mixed signal S54 is correspondingly also equal to zero. Such a phase shift of 180° between a first and second signal Vs1, Vs2 is detected by using the difference signal S53. A signal detector 55 supplied with this difference signal S53 detects whether the amplitude of the difference signal S53 is not equal to zero. The output signal of the signal detector 55 and the output signal of the two threshold detectors 56, 57 are supplied to a logic unit 58, at the output of which the second demodulation signal b' is available. The logic unit is implemented in such a manner that the demodulation signal 52 or the received symbol b', respectively assumes a High level when the signal detector 55 detects an amplitude of the difference signal S53 not equal to zero but when the mixed signal S54 does not exceed the positive threshold value and does not drop below the negative threshold value.

Thus, an exclusion criterion is used for determining the second demodulation signal b'. A phase shift of 180° between the first and second received signal Vs1, Vs2 is thus used as a basis when the difference signal S53 has an amplitude not equal to zero but when the output signals of first and second threshold detector 56, 57 do not point to a phase shift of +90° or −90°. Assuming that the output signal S55 of the signal detector 55 assumes a High level when the amplitude of the difference signal S53 is not equal to zero, that the output signal S56 of the first threshold detector 56 assumes a High level when the mixed signal S54 is below the negative threshold value and that the output signal S57 of the second threshold detector 57 assumes a High level when the mixed signal S54 is above the positive threshold value, the following applies for he received symbols a', b', c':

$$a' = S56 \quad (4a)$$

$$b' = S55 \text{ (AND NOT } (S56 \text{ or } S57)) \quad (4b)$$

$$c' = S57. \quad (4c)$$

In the text which follows, the operation of the demodulation circuit shown in FIG. 6 is explained for sinusoidal received signals Vs1, Vs2. To simplify the explanation, it is assumed that these signals have equal amplitudes. In the case of a transmitted transmit symbol a, that is to say with a phase shift between a first and second signal Vs1, Vs2 of 90°, the following applies for the sum signal 51, the phase-shifted sum signal S52, the difference signal S53 and the mixed signal S54:

$$S51 = \sin\omega t + \sin(\omega t + 90°) = 2\sin\frac{2\omega\omega + 90°}{2} \cdot \cos(-45°) = \quad (5a)$$
$$\sqrt{2}\sin + \frac{2\omega\omega + 90°}{2} = \sqrt{2}\sin(\omega t + 45°)$$

$$S52 = \sqrt{2}\sin(\omega t + 135°) \quad (5b)$$

$$S53 = \sin\omega t - \sin(\omega t + 90°) = 2\cos\frac{2\omega t + 90°}{2} \cdot \sin(-45°) = \quad (5c)$$
$$-\sqrt{2}\cos(\omega t + 45°) = -\sqrt{2}\sin(\omega t + 135°)$$

$$S54 = -2 \cdot \sin^2(\omega t + 135°) = -1 + \cos(2\omega t + 270°). \quad (5d)$$

At this phase shift of 90°, the phase-shifted sum signal S52 and the difference signal S53 are thus antiphase signals of the same frequency. The mixed signal S54 has a negative DC component and a positive sinusoidal oscillation component. The first threshold detector 56 is implemented in such a manner that it only evaluates the negative DC component of the mixed signal S54 and compares it with the negative threshold signal. For this purpose, the threshold detector 56 can be implemented in such a manner that it forms the mean of the mixed signal S54 and compares the mean of the mixed signal with the negative threshold value. However, the circuit of a threshold detector 56 which is inert in that it does not follow changes of the mixed signal S54 with the frequency 2ωt is simpler to implement. In this case, the threshold detector 56 effectively only evaluates the negative DC component of the mixed signal S54.

At a phase shift of 270° or −90° between the first and second signal Vs1, Vs2, the following applies to the sum signal S51, the phase-shifted sum signal S52, the difference signal S53 and the mixed signal S54:

$$S51 = \sin\omega t + \sin(\omega t + 270°) = 2\sin\frac{2\omega t + 270°}{2} \cdot \cos - 135° = \quad (6a)$$
$$-\sqrt{2}\sin\frac{(2\omega t + 270°)}{2} = -\sqrt{2}\sin(\omega t + 135°)$$

$$S52 = \sqrt{2}\sin(\omega t + 225°) \quad (6b)$$

$$S53 = \sin\omega t - \sin(\omega t + 270°) = 2\cos\frac{2\omega t + 270°}{2} \cdot \sin - 135° = \quad (6c)$$
$$-\sqrt{2}\cos(\omega t + 135°) = \sqrt{2}\sin(\omega t + 225°)$$

$$S54 = 2\sin^2(\omega t + 225°) = 1 + \cos(2\omega t + 90°). \quad (6d)$$

In this case, the phase-shifted sum signal S52 and the difference signal S53 are therefore in-phase signals of the same frequency. The mixed signal S54 has a positive DC component and a positive oscillation component in this case. Corresponding to the threshold detector 56, the threshold detector 57 is arranged for only evaluating the DC component of the mixed signal S54 and comparing this DC component with the positive threshold value.

At a phase shift of 180° between the first and second signal Vs1, Vs2, the following applies to the addition signal S51, the phase-shifted addition signal S52:

$$S51 = \sin\omega t + \sin(\omega t + 180°) = 0 \tag{7a}$$

$$S52 = 0 \tag{7b}$$

$$S53 = \sin\omega t - \sin(\omega t + 180°) = 2\cos\frac{2\omega t + 180°}{2} \cdot \sin(-90°) \tag{7c}$$

$$S54 = 0. \tag{7d}$$

The difference signal S53 has an amplitude not equal to zero, whereas the mixed signal S54 is equal to zero in the manner already explained.

The demodulation circuit 50 as shown in FIG. 6 is thus capable of detecting three different phase relations of the first and second signals Vs1, Vs2 and generating demodulation signals S1', S2', S3' and received symbols a', b', c' which are dependent on these phase shifts.

The demodulation circuit 50 shown in FIG. 6 requires threshold detectors 56, 57 which compare the output signal S54 of the mixer 54 with a negative or a positive threshold value, respectively. This threshold value is dependent on the amplitude of the received signals Vs1, Vs2.

Figure 7:
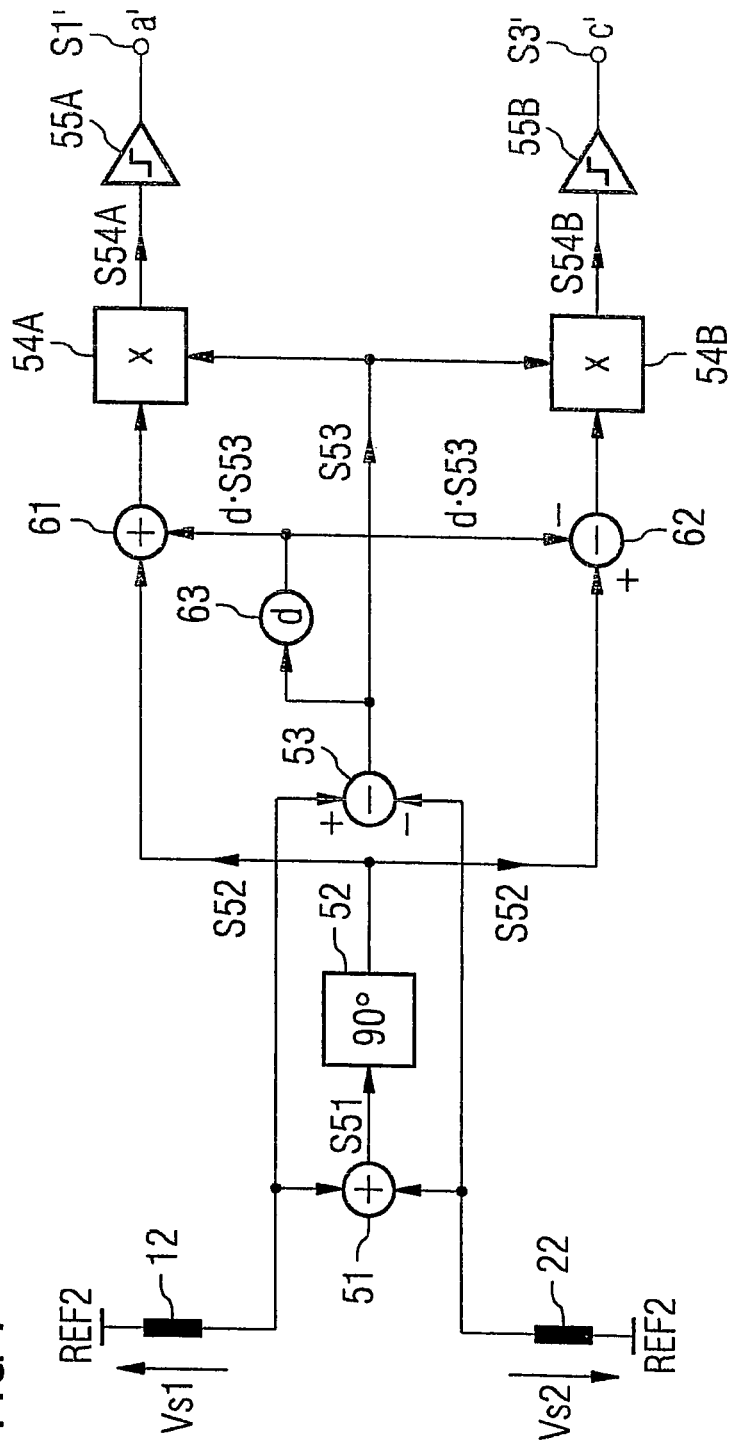
FIG. 7 shows a further example of a receiving circuit on the secondary side.

FIG. 7 shows an example of a demodulation circuit in which the evaluation of the phase relation between the first and second received signal Vs1, Vs2 is independent of the amplitude of these signals. This demodulation circuit has two mixers 54A, 54B which are in each case supplied with the difference signal S53. Output signals S54A, S54B of these mixers 54A, 54B are supplied to threshold detectors 55A, 55B following the mixers 54A, 54B. These threshold detectors only need to be capable of evaluating signs of the respective output signal S54A, S54B of the mixers 54A, 54B.

In this demodulator 50, the first demodulation signal S1 or the first received symbol a' is available at the output of the first threshold detector 55A and the third demodulation signal S3 or the third received symbol c', respectively, is available at the output of the second threshold detector 55B. The first threshold detector 55A is arranged for generating a High level of the first demodulation signal S1 when the output signal S54A of the first mixer has a negative sign or when the DC component of this first mixer output signal S54A has a negative sign, respectively. The second threshold detector 55B is arranged for generating a High level of the third demodulation signal S3' when the output signal S54B of the second mixer 54B has a positive sign or when the DC component of this second mixer output signal S54B has a positive sign, respectively.

The further input of the first mixer 54A is supplied with a sum signal which is the result of the phase-shifted sum signal S52 and an attenuated difference signal d·S53, with d<1. This sum signal is available at the output of a further adder 61 which is supplied with the phase-shifted sum signal S52 and the attenuated difference signal d·S53. The attenuated difference signal d·S53 is available at the output of an amplifier 63 with a gain d<1.

The further input of the second mixer 54B is supplied with a difference signal which is available at the output of a further subtractor 62 which is supplied with the phase-shifted sum signal S52 with positive sign and the attenuated difference signal d·S53 with negative sign.

With this arrangement, the following applies for the first mixer output signal S54A:

$$S54A = S53 \cdot (d \cdot S53 + S52) = S52 \cdot S53 + d \cdot S53^2 \tag{8a}$$

Correspondingly, the following applies for the output signal S54B of the second mixer 54B:

$$S54B = S53 \cdot (S52 - d \cdot S53) = S52 \cdot S53 - d \cdot S53^2 \tag{8b}$$

The first mixer output signal S54A differs from the output signal S54 of the demodulation circuit according to FIG. 6 by a positive offset d·S53² which is obtained from the square of the difference signal S53 multiplied by the damping factor d. The damping factor d is selected in such a manner that with a phase shift of 90° between the first and second received signal Vs1, Vs2, the DC component of the mixer output signal S54A is still less than zero, but with a phase shift of 180°, the DC component of the mixer output signal S54A is reliably greater than zero. At the output of the first threshold detector 55A, a High level is present for the first demodulation signal S1' only when the phase shift between the first and second received signal Vs1, Vs2 is between 60° and 120°, ideally 90°. At a phase shift of 270° between the first and second received signal Vs1, Vs2, the product of the phase-shifted sum signal S52 and the difference signal S53 is already greater than zero (compare equation 6d), so that the output signal of the first threshold detector 55A is reliably zero at this phase shift.

The output signal S54B of the second mixer 54B differs from the mixer output signal S54 of the demodulation circuit in FIG. 6 by a negative offset −d·S53². At a phase shift of 270°, this negative offset leads to the output signal S54B of the second mixer 54B being smaller than the output signal of the mixer S54 in FIG. 6. However, the damping factor d is selected in such a manner that the mixer output signal S54B is reliably greater than zero. At a phase shift of 180°, the negative additive offset −d·S53² leads to the mixer output signal S54B of the second mixer 54B being reliably less than zero. At the output of the second threshold detector 55B, a High level is thus available for the third demodulation signal S3 only when the phase shift between the first and second received signal Vs1, Vs2 is between 240° and 300°, ideally 270°.

The signal detector 55 and the logic circuit 58, not shown in greater detail in FIG. 7 for reasons of clarity, determine the second demodulation signal b' from the first and third demodulation signal S1', S3' and the first and third received symbol a', c', respectively, by means of the exclusion criterion already explained previously by means of equation 4b.

Figure 8:
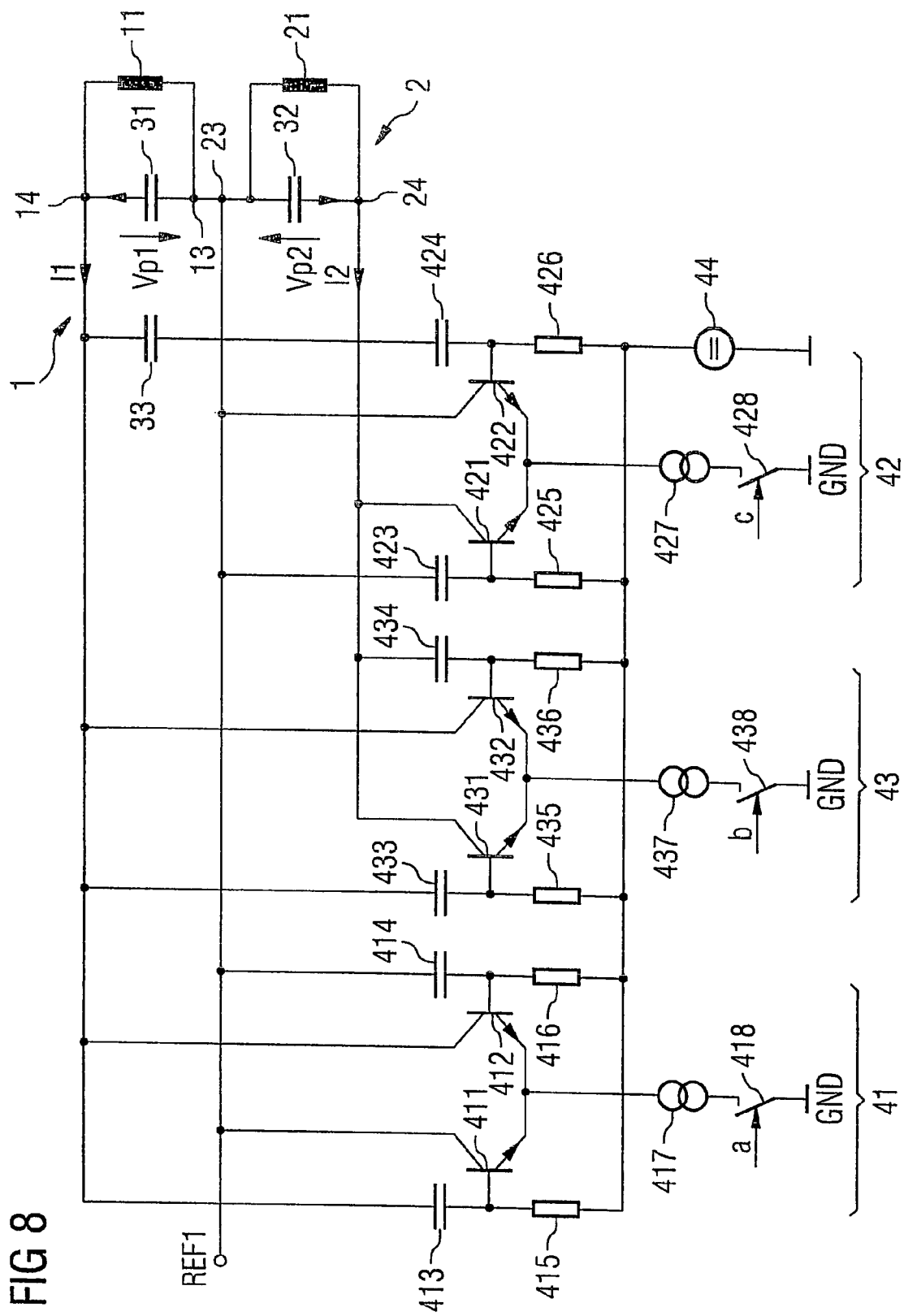
FIG. 8 shows an example of the excitation circuits.

FIG. 8 shows an example of an implementation of the excitation circuits 41, 42, 43 which excite the resonant circuits 11, 31 and 21, 32, respectively into oscillations with different phase relations in dependence on the transmit signals a, b, c to be transmitted. Each of these excitation circuits has a controllable current source 417, 427, 437 which is controlled, i.e. switched on or off in the present case by the respective control signal S1, S2, S3. In the example shown in FIG. 6, the current sources 417, 427, 437, which are called first to third current source in the text which follows, are controlled by switches 418, 428, 438 which are in each case connected in series with the current sources 417, 427, 437 and which are switched on or off by the control signals S1, S2, S3. In this arrangement, a switch 418, 428, 438 which is switched on, activates the respective current source 417, 427, 437, whereas a switch 418, 428, 438 which is switched off deactivates the respective current source 417, 427, 437.

In the circuit shown, the first resonant circuit 1 is excited by the first excitation circuit 41 by means of a first excitation current I1 at the connection 14 of this resonant circuit 1. The current intensity of the first excitation current I1 varies between an upper signal level, which corresponds to the current intensity of the current delivered by the current source 417 in the example, and a lower signal level which corresponds to zero in the example. The first excitation current I1 has an approximately rectangular signal variation which is dependent on the voltage Vp1 across the first resonant circuit 1. In the circuit shown in FIG. 8, the signal level of the first excitation current I1 varies in dependence on the polarity of the resonant circuit voltage Vp1. With a negative voltage Vp1 between the second and first connection 14, 13, the excitation current I1 assumes its upper signal level in order to amplify the oscillation, and with a positive voltage Vp1 between the second and first connection 14, 13, the excitation current I1 assumes its lower signal level so that the oscillation is not damped.

When the first current source 417 is activated, the pulsed first excitation current I1 is generated from the current provided by this current source 417 by means of a switchover device 411-416. For this purpose, the current source 417 is connected to the second connection 14 by the switchover device 411-416 in dependence on the polarity of the resonant circuit voltage Vp1, which corresponds to an upper signal level of the first excitation current I1, or to the first connection 13 of the resonant circuit. The first connection 13 of the resonant circuit 1 is connected to the terminal for the first reference potential REF1 on the primary side which, for example is a positive supply potential with values between 5 V and 20 V. When the first current source 417 is connected to the first connection 13 of the resonant circuit, a current flows directly from the terminal for the supply potential REF1 to the reference potential GND and as a result the excitation current I1 is zero.

The switchover device 411-416 has two transistors 411, 412 which have the function of switching elements and are implemented as bipolar transistors in the example. The load path (collector-emitter path) of a first one 411 of the transistors is connected between the first connection 13 of the first resonant circuit 1 and the first current source 417 and the load path of a second one of the transistors is connected between the second connection 14 of the first resonant circuit 1 and the first current source 417.

At the same time, the transistors 411, 412 are part of a comparator arrangement which determines the polarity of the resonant circuit voltage Vp1 and which drives one of the two transistors 411, 412 in dependence on this polarity. The control connection (base connection) of the first transistor 411 is coupled to the second connection 14 of the resonant circuit whilst the control connection of the second transistor 412 is coupled to the first connection of the first resonant circuit 1.

Capacitors 413, 414 between the base connections of the transistors 411, 412 and the connections 13, 14 of the resonant circuit 1 are used for capacitively decoupling the base potentials of these transistors from the potentials at the resonant circuit connections 13, 14. To adjust the operating points of the two transistors 411, 412, resistors 415, 416 are provided which are connected between the base connections of these transistors 411, 412 and a reference potential source 44. The voltage supplied by this reference potential source 44 is used for adjusting the operating point of the two transistors 411, 412. Only one of the two transistors 411, 412 is in each case driven to conduct, namely that one of the two transistors the base of which is connected to the resonant circuit connection 13, 14 which is currently at positive potential. During the positive half wave of the oscillation when the resonant circuit voltage Vp1 is positive, the first transistor 411 conducts and thus connects the current source 417 to the first resonant circuit connection 413. During the negative half wave, when the potential is greater at the first resonant circuit connection 13 than at the second resonant circuit connection 14, the second transistor 412 conducts and thus connects the current source 417 to the second resonant circuit connection 14.

The second resonant circuit 2 is excited by the second excitation circuit 42 correspondingly to the excitation of the first resonant circuit 1 by the first excitation circuit 41.

The second excitation circuit 42 generates a pulsed second excitation current I2 at the second resonant circuit connection 24 in dependence on the polarity of the resonant circuit voltage Vp2 of this second resonant circuit. During a positive half wave when this voltage Vp2 is positive, the second excitation current I2 is zero. During this oscillation phase, the second current source 427 is connected via a second transistor 422 of a second switchover device 421-426 to the supply potential REF1 at the first resonant circuit connection 23. The base of this second transistor 422 is connected to the second resonant circuit connection 24 via a capacitance 424. During a negative half wave of the oscillation, that is to say during a negative voltage VP2, the current source 427 is connected to the second connection 24 of the resonant circuit via a first transistor 421 of the switchover device as a result of which the second excitation current I2 assumes an upper signal level. The base connection of the first transistor 421 is connected to the first resonant circuit connection 23 via a capacitor 423. To adjust the operating points of the bipolar transistors 421, 422, their base connections are connected to the reference voltage source 44 via resistors 425, 426.

The third excitation circuit 43 for exciting the two resonant circuits 1, 2 in antiphase is implemented in accordance with the first and second excitation circuit 41, 42 and has a third current source 437 and a switchover device 431-436 used for connecting the current source 437 either to the second connection 24 of the second resonant circuit 2 via a first transistor 431 or to the second connection 14 of the first resonant circuit 1 via a second transistor 432. These two transistors 431, 432 are driven in dependence on the potentials at these second resonant circuit connections 14, 24. The first transistor 431 is coupled to the second connection 14 of the first resonant circuit 1 whilst the base connection of the second transistor 432 is coupled to the second connection 24 of the second resonant circuit 2. During a positive half wave of the oscillation of the first resonant circuit 1 the first transistor 431 conducts in order to amplify the oscillation of the second resonant circuit, which then has a negative half wave, during this phase. During the positive half wave of the oscillation of the second resonant circuit 2 the second transistor 432 conducts in order to amplify the oscillation of the first resonant circuit 1, which then has a negative half wave, during this phase.

Figure 9:
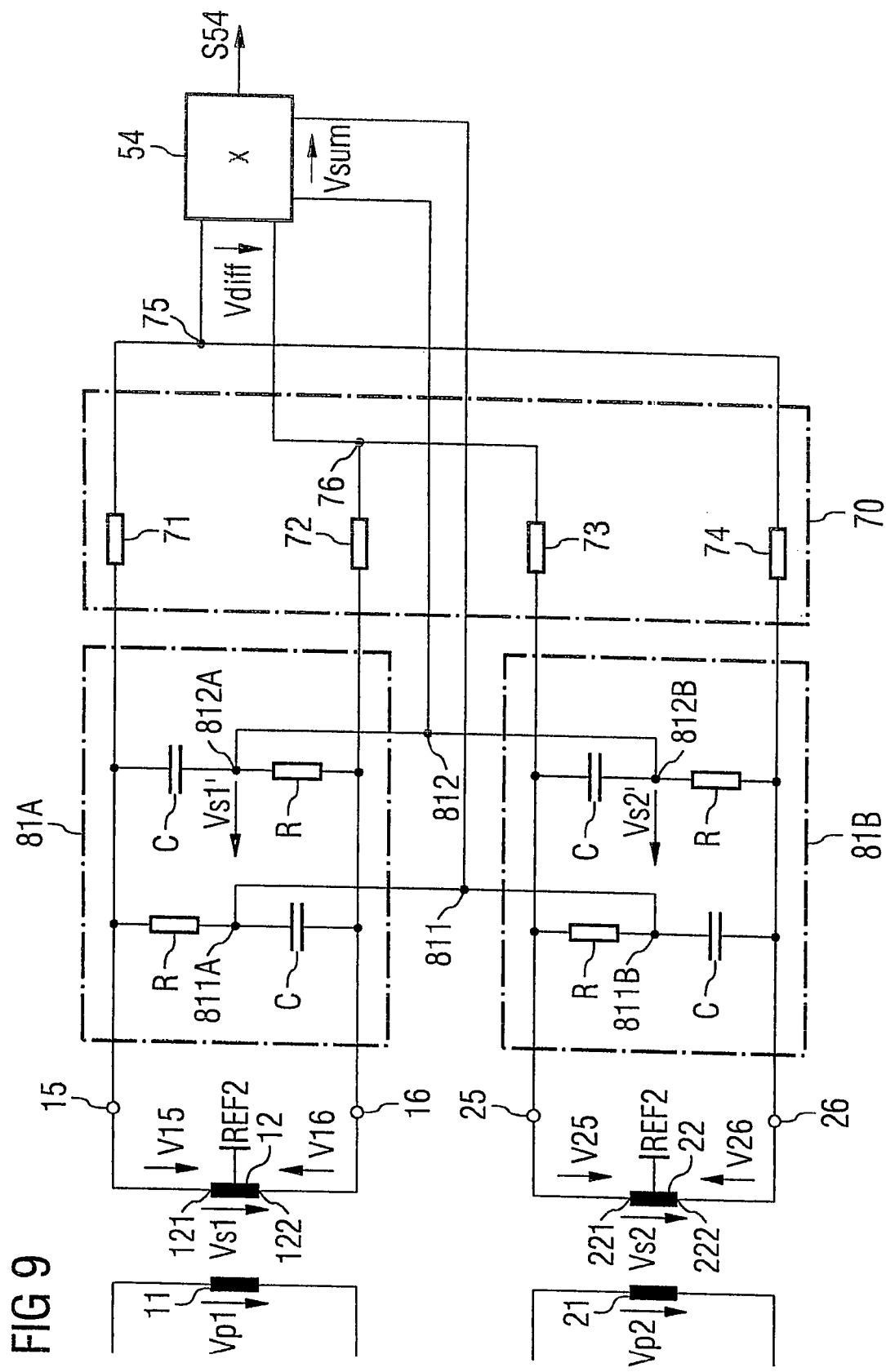
FIG. 9 shows a further example of the receiving circuit on the secondary side.

FIG. 9 shows an example of the demodulation circuit 50 which fulfils the same function as the demodulation circuit shown in FIG. 6 and which performs additions, subtractions and phase shifts by exclusively using passive components, by using resistors and capacitors in the present case. In the example shown, the secondary windings 12, 22, across which the secondary voltages Vs1, Vs2 are present, in each case have two winding sections 121, 122 and 221, 222, respectively. The winding sections 121, 122 and 221, 222, respectively of a secondary winding 12, 22 are in each case coupled inductively to the associated primary winding 11, 21 of the respective transformer 12, 20. The winding sections 121, 122 and 221, 222 respectively of a secondary winding 12, 22 are wound oppositely to one another and are connected in each case to the reference potential REF2 on the secondary side with one connection. Connections of the winding sections 121, 122 and 221, 222, respectively, which face away from the connection for the reference potential REF2 on the secondary side form connections 15, 16 and 25, 26 respectively, of the secondary windings 12, 22 at which the secondary voltages Vs1, Vs2 can be picked up. The following applies for voltages V15, 16 between the first and second connection 15, 16 of the first secondary winding 12 with respect to the reference potential REF2 on the secondary side:

$$V16=-V15. \quad (9a)$$

The following correspondingly applies to voltages V25, 26 between the first and second connection 25, 26 of the second secondary winding 22 with respect to the reference potential REF2 on the secondary side:

$$V26=-V25. \quad (9b)$$

In the demodulation circuit shown in FIG. 9, a difference voltage Vdiff, to which Vdiff=0.5·(Vs1−Vs2) applies, is generated by a resistance network 70. This resistance network 70 has two circuit nodes 75, 26 between which the difference voltage Vdiff is present. A first connection 15 of the first secondary winding 12 is connected to the first circuit node 75 of the resistance network 70 via a first resistor 71, and a second connection 16 of the first secondary winding 12 is connected to the second circuit node 76 of the resistance network 70 via a second resistor 72. Correspondingly, a first circuit node 25 of the second secondary winding 22 is connected to the first circuit node 75 of the resistance network 70 via a third resistor 73 and a second connection 26 of the second secondary winding 22 is connected to the second connection 76 of the resistance network 70 via a fourth resistor 74.

In this demodulation circuit, the mixer 54 has a first pair of connections which are connected to the first and second connections 75, 76 of the resistance network 70 and via which the mixer 54A, 54B is supplied with the difference signal Vdiff.

Apart from the first pair of connections, the mixer 54 has a second pair of connections which are supplied with a sum voltage signal Vsum which corresponds to the phase-shifted sum of the first and second secondary voltage Vs1, Vs2. This sum signal Vsum is generated by two all-pass filters 81A, 81B, a first one of which is connected between the first and second connection 15, 16 of the first secondary winding 12 and filters the first secondary voltage Vs1, and a second one of which is connected between the first and second connection 25, 26 of the second secondary winding 22 and filters the second secondary voltage Vs2. The two all-pass filters 81A, 81B are in each case implemented by using two resistors and capacitors and in each case have two outputs 811A, 811B, 812A, 812B. The outputs of the all-pass filters 81A, 81B are connected to one another by connecting a first output 811A of the first all-pass filter 81A to a first output 811B of the second all-pass filter 81B and a second output 812A of the first all-pass filter 81A to a second output 812B of the second all-pass filter 81B. Without any further circuitry, a voltage Vs1' corresponding to the first secondary voltage Vs1 phase-shifted by 90° would be present between the outputs 811A, 812A of the first all-pass filter 81A and a voltage Vs2' corresponding to the second secondary voltage Vs2 phase-shifted by 90° would be present between the outputs 811B, 812B of the second all-pass filter 81B.

The two all-pass filters 81A, 81B are in each case identically dimensioned and the time constant is R·C=1/(2Πf) so that a sum signal Vsum is present between the common outputs 811, 812 for which the following applies:

$$V\text{sum}=0.5[Vs1(\omega t+90°)+Vs1(\omega t+90°)] \quad (10).$$

In addition, a passive network of resistors and capacitors can also be used for generating voltage signals which are composed of a sum of the first and second secondary voltages Vs1, Vs2 and an attenuated difference of these first and second secondary voltages as will be explained by means of FIGS. 10 and 11 in the text which follows.

Figure 10:
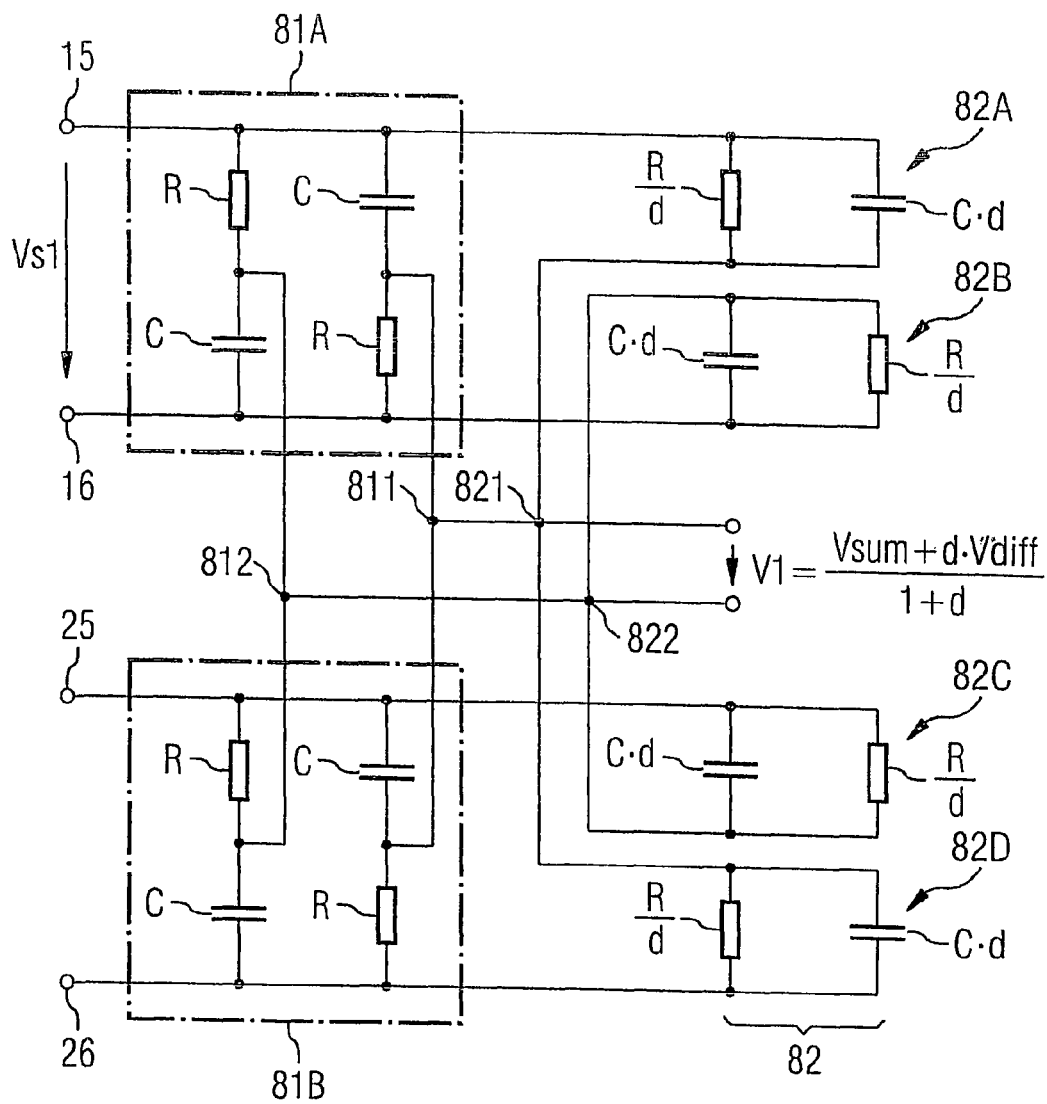
FIG. 10 shows an example of a passive network for implementing the receiving circuit according to FIG. 7.

FIG. 10 shows an arrangement for generating a sum signal which is composed of a sum of the first and second secondary voltages and an attenuated difference of these secondary voltages, and for which the following applies:

$$V1=(V\text{sum}+d\cdot V\text{diff})/(1+d), \quad (11)$$

where Vdiff=(Vs1−Vs2)/2 and d designates a positive weighting factor of less than 1.

Apart from the all-pass filters 81A, 81B, which have common outputs and which have already been explained previously by means of FIG. 9, the circuit arrangement shown has a resistance network 82 with complex impedances 82A-82D which has two outputs 821, 822, a first output 821 of which is connected to the first common output 811 of the all-pass filters 81A, 81B, and a second one of which is connected to the second common output 812 of the all-pass filters 81A, 81B. In this complex impedance network, the first connections 15, 25 of the secondary windings are connected to the first connection 821 via one of the complex impedances in each case. In addition, the second connections 16, 26 of the secondary windings are connected to the second connection 822 via one of the complex impedances in each case. The complex impedances 82A-82D of the resistance network 82 are in each case identically dimensioned and are in each case implemented by a parallel circuit of an ohmic resistor and a capacitor. The resistance values of the ohmic resistors are R/d, where R is the resistance value of the identical ohmic resistances of the all-pass filters 81A, 81B and d is a positive damping factor of less than 1. The capacitance values of the capacitors of the complex impedances are C·d, where C is the capacitance value of the identical capacitors of the all-pass filters 81A, 81B and d is the positive damping factor of less than 1.

With this dimensioning of the complex impedances 82A-82D, adjusted to match the components of the all-pass filters 81A, 81B, it can be shown that the relation (11) specified above, applies to the voltage between the common connections of the all-pass filters 81A, 81B and of the resistance network.

A passive network of the type shown in FIG. 10 is also sui-suitable for generating an output signal $$V2=(V\text{sum}-d\cdot V\text{diff})/(1+d) \quad (12)$$

from the secondary voltages Vs1, Vs2. For this purpose, the network shown in FIG. 10 may be modified in such a manner that the second connection 822 of the resistance network 82 is connected to the first common connection 811 of the all-pass filters 81A, 81B and the first connection 821 of the resistance network 82 is connected to the second common connection 812 of the all-pass filters 81A, 81B.

Figure 11:
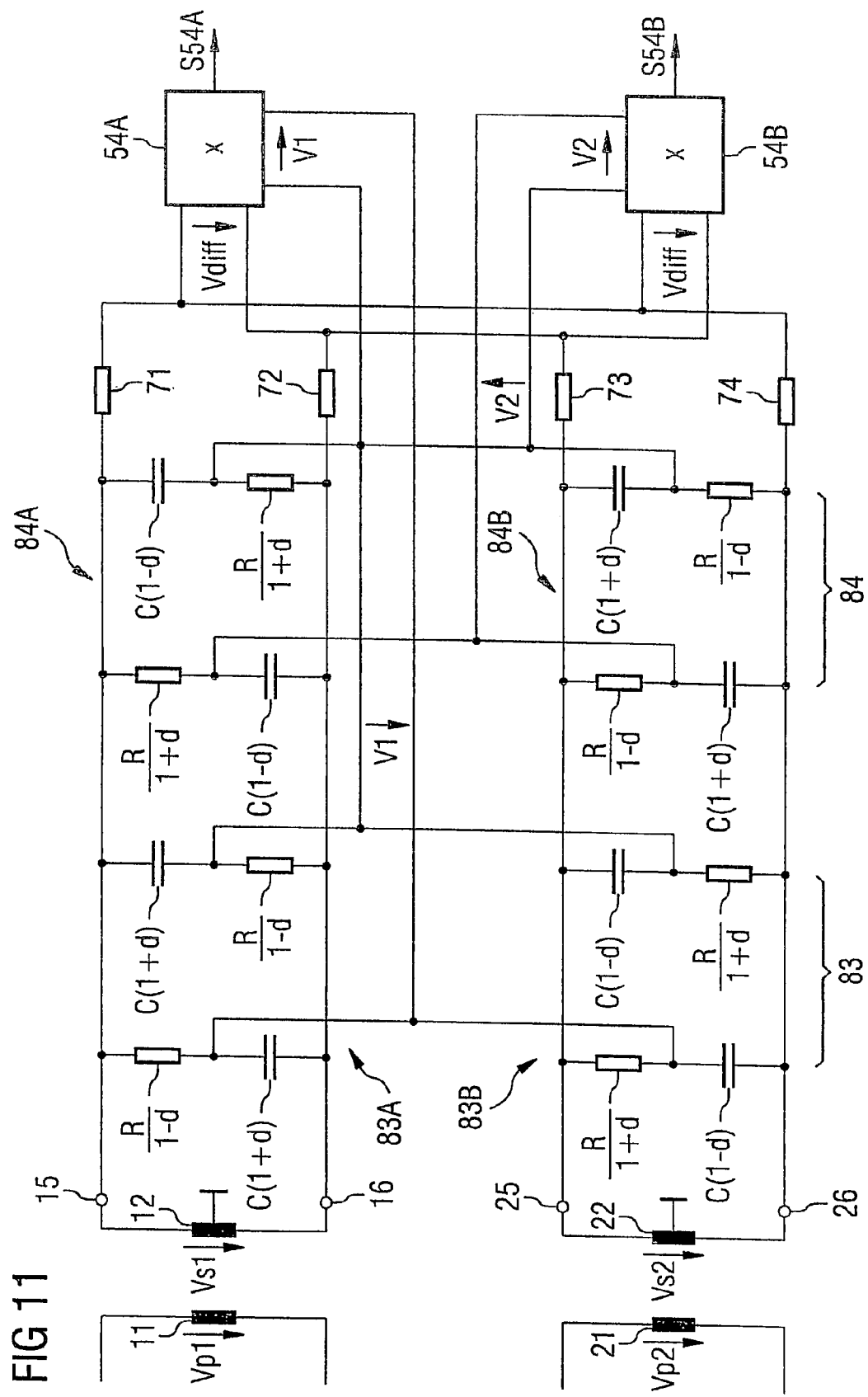
FIG. 11 shows a further example of a receiving circuit on the secondary side.

The passive network with 16 components, shown in FIG. 10, can be reduced to a passive network 83 having only 8 components which is shown in an example of a demodulation circuit in FIG. 11. The simplification is obtained when components connected in parallel are combined to form one component and when components which are connected to oppositely phased signals are replaced by elements connected in parallel, one of which is negative, these parallel-connected components then being combined again to form one component.

The reduced network 83 comprises a first bridge filter 83A which is connected between the connections 15, 16 of the first secondary winding 12 and which has two resistors and two capacitors in each case. One resistor and one capacitor each are connected in series with one another between the connections 15, 16 of the first secondary winding. Center taps of these series circuits form outputs of the first bridge filter. Referred to the resistance values of the resistors of the all-pass filters and the capacitance values of the capacitors of the all-pass filters according to FIG. 9, the resistance values of the resistors of the first bridge filter 83A are R/(1−d) and the capacitance values of the capacitors are C·(1+d).

The reduced network 83 also comprises a second bridge filter 83B which is connected between the connections 25, 26 of the second secondary winding 22 and which is configured in accordance with the first bridge filter 83A. The resistance values of the resistors of this second bridge filter 83B are R/(1+d) and the capacitance values of the capacitors are c(1−d). The outputs of the first second bridge filter 83A, 83B are connected to one another by connecting a first output of the first bridge filter 83A to a first output of the second bridge filter 83B and a second output of the first bridge filter 83A to a second output of the second bridge filter 83B. Between the common outputs of these two bridge filters 83A, 83B, the first output signal V1 is available which comprises two signal components, a first positive signal component which is dependent on the sum of the phase-shifted secondary voltages Vs1, Vs2, and a second positive signal component which is dependent on the difference of the secondary voltages Vs1, Vs2.

If the network shown in FIG. 10 is modified in such a way that the output signal V2 is generated and the modified network is reduced, a second reduced network 84 is produced which is shown in FIG. 11. This reduced network has two bridge filters 84A, 84B, a first one of which is connected between the connections 15, 16 of the first secondary winding 12 and a second one of which is connected between the connections 25, 26 of the second secondary winding 22. The pairs of outputs of the two bridge filters 84A, 84B are connected to one another. Between the common outputs of the two bridge filters 84A, 84B, the second output signal V2 is available which comprises two signal components, a first positive signal component which is dependent on the sum of the phase-shifted secondary voltages Vs1, Vs2, and a second negative signal component which is dependent on the difference of the secondary voltages Vs1, Vs2.

Corresponding to the demodulation circuit according to FIG. 7, the demodulation circuit shown in FIG. 11 has two mixers 54A, 54B. A first one 54A of the mixers is supplied with the difference signal Vdiff and the first output signal V1 of the first reduced network 83, and a second one 54B of the mixers is supplied with the difference signal Vdiff and the second output signal V2 of the second reduced network 84. Output signals S54A, S54B of these mixers are processed further in the manner already explained.

The signal transformer explained above can be used for transmitting, in the manner explained, three transmit symbols a, b, c which can be distinguished from one another.

In the following, a possible transmitting method for such a signal transformer will be explained by means of FIG. 12. FIG. 12 shows a two-valued data sequence D to be transmitted and the sequence S of transmit symbols a, b, c transmitted resulting from this data sequence. The conversion of the data sequence D to the transmit symbol sequence S will be called coding. In the examples shown, this coding is performed in such a manner that the transmit symbol sequence S does not comprise two equal successive transmit symbols a, b, c. This provides for a self-synchronizing data transmission, i.e. no additional clock signal is to be transmitted together with the data signal since for each data symbol of the data symbol sequence D, a separate transmit symbol is transmitted which differs from the preceding transmit symbol. The data symbol sequence D is coded into the transmit symbol sequence S in such a manner that a first one of the three transmit symbols, the transmit symbol a in the example, is transmitted for a first data symbol, the data symbol "1" in the example. For a second data symbol, "0" in the example, a second one of the three transmit symbols is transmitted, the transmit symbol c in the example. The third one of the three transmit symbols, the transmit symbol b in the example, is transmitted in order to indicate a repeated transmission of one of the first and second data signals. A data sequence 1 1 1 1 1 1 ... having a number of successive first data signals thus re-suits in a transmit symbol sequence a b a b a b ..., whilst a data signal sequence 0 0 0 0 0 0 ... with a number of successive second data signals results in a data symbol sequence c b c b c b ....

This coding arrangement explained above is illustrated again in FIG. 13. FIG. 13 shows a coding of a data sequence beginning with the first data symbol 1 in the left-hand part and a coding of a data sequence beginning with a second data symbol 0 in the right-hand part. Apart from the data symbols, the transmitted transmit symbols are shown in each case. The coding arrangements shown in each case show the coding of three successive data symbols. In this coding, the mapping of a data symbol to a transmit symbol depends on the preceding data symbol. A data symbol and associated transmit symbol of the coding arrangement shown in FIG. 13 in each case form a state of the coding arrangement and the states 1/c and 0/a form initial states of this coding. The coding arrangements repeat whenever one of these initial states is reached within the coding arrangement.

Pauses in the signal transmission, that is to say time periods during which no data symbols are to be transmitted and during which no transmit symbols are correspondingly transmitted can be determined by evaluation of the amplitude of the difference signal, referring to the explanation for FIGS. 4 and 5. The amplitude of this difference signal is 0 or is below a predetermined signal level whenever no transmit symbols are transmitted.

During an interference-free transmission, the received symbol sequence present at the output of the demodulator 50 corresponds to the transmit symbol sequence. Knowing the coding arrangement applied at the transmitter end, the transmitted data sequence can be reconstructed in a simple manner from this transmit symbol sequence. The reception of the third received symbol c' stands for a first transmitted data symbol, the reception of the first received symbol a' stands for a second transmitted data symbol and the reception of the second received symbol b' stands for the same data symbol as that received immediately before.

A further transmitting method using the signal transformer explained above will be explained by means of FIG. 14. The subject matter of this signal transmitting method is the transmission of three data sequences D0, D1, D2 which are in each case two-valued. In this signal transmitting method, transmit symbol sequences with three transmit symbols are transmitted in particular time intervals. These three successively transmitted transmit symbols represent the respective signal level of the data sequences D0, D1, D2. In the example shown in FIG. 14, the transmit symbol transmitted first represents the signal level of the first data sequence D0, the second transmit symbol transmitted represents the data value of the second data sequence D1 and the third transmit symbol transmitted represents the data value of the third data sequence D2. A High level of the respective data sequence is transmitted by a first transmit symbol, the transmit symbol c in the example, whereas a low level of the respective data sequence is transmitted in the form of a second transmit symbol, in the form of the transmit symbol a in the example. The coding is performed in such a manner that no two identical transmit symbols are transmitted immediately in succession. This is achieved by the second transmit symbol b being transmitted instead of a repeated transmission of the first or third transmit symbol a, c.

Figure 15:
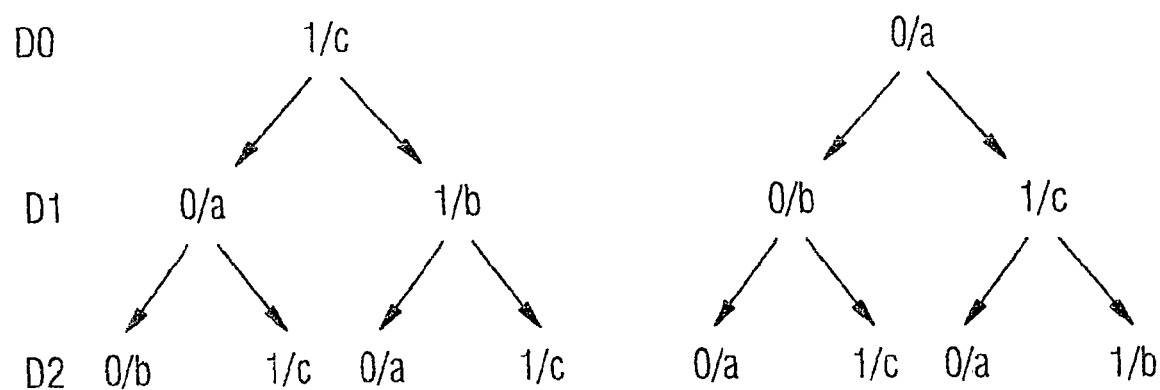
FIG. 15 illustrates a coding arrangement for the method explained in FIG. 14.

FIG. 15 shows the coding arrangement as a basis of the transmitting method explained by means of FIG. 14. In FIG. 15, a "1" stands for a High level of the respective data sequence and a "0" stands for a Low level of the respective data sequence D0-D2. Apart from the respective values of the data sequence, the transmit symbols transmitted are reproduced in FIG. 15.

For the sake of clarity the primary voltages Vp1, Vp2 of the signal transformer are also shown in FIG. 14, in addition to the data sequences D0-D2 and the transmit symbols a-c transmitted.

FIG. 16 shows by way of example variations with time of the data sequences D0, D1, D2, of the voltages Vs1, Vs2 which can be picked up on the secondary side at the signal transformer, of the difference signal (S53 in FIGS. 6 and 7 and Vdiff in FIG. 9), of the sum signal and of the demodulation signals, a', c' for the data transmitting method previously explained. In the case of an interference-free transmission, these demodulation signals a', c' correspond to the transmit symbols a, c transmitted. FIG. 16 also shows the output signal of the amplitude evaluating unit (55 in FIG. 6) which evaluates the amplitude of the difference signal. Pauses in the signal transmission are clearly present when the amplitude of this difference symbol or of the evaluating signal S55 is zero.

FIG. 17 shows a modification of the signal transmitting device shown in FIG. 1. In the signal transmitting device, there are only two excitation circuits 41, 43 so that two different phase relations of the parallel resonant circuits 1, 2 can be set for a data transmission, in the example shown, phase shifts of +90° and −90° can be set.

In the signal transformers previously explained, the resonant circuits 1, 2 are preferably excited in such a manner that no in-phase oscillations are produced in the two resonant circuits. Such in-phase oscillations can be excited, for example, by interference signals which act identically on the resonant circuits. By not using in-phase signals for transmitting data, it is possible to reliably distinguish between useful signals and interference signals. In the demodulation circuits 50 previously explained, in-phase signals would lead to a difference signal equal to zero so that the output signals of the mixers are also equal to zero. As a result, the interference signals are reliably filtered out.

In the previous explanation it has been assumed that the two resonant circuits 1, 2 are excited for signal transmission in such a manner that phase shifts of 90°, 180° and 270° (FIG. 1) or 90° and 270° (FIG. 17) of the oscillations occur. Naturally, any other types of excitation can be used in which the resonant circuits are excited into oscillations with a different phase angle. In particular, the possibility exists to set more than three different phase angles, for example, 90°, 135°, 180°, 225° and 270°, in order to be able to transmit five different transmit symbols.

Summarizing, one embodiment of the invention relates to a signal transmitting device which comprises a first resonant circuit with a resonant circuit inductance and a resonant circuit capacitance, a second resonant circuit with a resonant circuit inductance and a resonant circuit capacitance, and a coupling element coupling the first resonant circuit to the second resonant circuit. A first excitation circuit is coupled to the first resonant circuit, and at least one further excitation circuit is coupled to the second resonant circuit. The transmitting device furthermore comprises at least one first inductive component which is coupled inductively to the resonant circuit capacitance of the first resonant circuit, and at least one second inductive component which is coupled inductively to the resonant circuit capacitance of the second resonant circuit.

Furthermore, a signal transmitting method for transmitting at least two different transmit symbols is provided which comprises providing a transmitting device with a first resonant circuit which has a resonant circuit inductance and a resonant circuit capacitance and to the resonant circuit capacitance of which a first inductive element is coupled and with a second resonant circuit which has a resonant circuit inductance and a resonant circuit capacitance and to the resonant circuit capacitance of which a second inductive element is coupled. The method comprises exciting the first resonant circuit and the second resonant circuit into phase-shifted oscillations with a phase shift not equal to zero, which is different for each of the at least two different transmit symbols, and evaluating a phase relation of signals which can be picked up at the secondary windings of the transformers.

The foregoing description of specific embodiments reveals the general nature of embodiments of the inventive subject matter sufficiently that others can, by applying current knowledge, readily modify and/or adapt it for various applications without departing from the generic concept, and therefore such adaptions and modifications are intended to be comprehended within the meaning and range of equivalents of the disclosed embodiments. It is intended that this invention be limited only by the following claims and equivalents thereof.

The invention claimed is:

1. A circuit comprising:
    a first resonant circuit having a resonant circuit inductance and a resonant circuit capacitance, and a second resonant circuit having a resonant circuit inductance and a resonant circuit capacitance;
    a coupling element coupling the first resonant circuit to the second resonant circuit;
    a first excitation circuit coupled to the first resonant circuit, and at least one further excitation circuit being coupled to the second resonant circuit;
    at least one first inductive component being coupled inductively to the resonant circuit capacitance of the first resonant circuit;
    at least one second inductive component being coupled inductively to the resonant circuit capacitance of the second resonant circuit.

2. The circuit of claim 1, further comprising a second excitation circuit coupled to the first and second resonant circuit.

3. The circuit of claim 2 wherein the first excitation circuit and the further excitation circuit are configured to excite the first and second resonant circuit into antiphase oscillations.

4. The circuit of claim 1, further comprising:
    a first transformer having a primary winding and a secondary winding, with the primary winding of said first transformer forming the resonant circuit inductance of the first resonant circuit, and with the secondary winding of the first transformer forming the first inductive component,
    a second transformer having a primary winding and a secondary winding, with the primary winding of said second transformer forming the resonant circuit inductance of the second resonant circuit, and with the secondary winding of said second transformer forming the second inductive component.

5. The circuit of claim 4, wherein the first excitation circuit is connected directly to the first resonant circuit and the further excitation circuit is connected directly to the second resonant circuit.

6. The circuit of claim 4, further comprising:
a first excitation winding being inductively coupled to the resonant circuit capacitance of the first resonant circuit and being connected to the first excitation circuit, and
a second excitation winding being inductively coupled to the resonant circuit capacitance of the second resonant circuit and being connected to the further excitation circuit.

7. The circuit of claim 1, further comprising:
a first transformer having a primary winding and a secondary winding, the secondary winding forming the resonant circuit inductance of the first resonant circuit, and the primary winding forming the first inductive component,
a second transformer having a primary winding and a secondary winding.

8. The circuit of claim 7, wherein the first excitation circuit is connected to the primary winding of the first transformer and the further excitation circuit is connected to the primary winding of the second transformer.

9. The circuit of claim 1, wherein the resonant circuits are coupled directly to one another.

10. The circuit of claim 1 wherein the first and second resonant circuits are coupled indirectly to one another.

11. The circuit of claim 1, wherein the coupling element is a capacitive or inductive coupling element.

12. The circuit of claim 1, wherein the first and second resonant circuits are parallel resonant circuits.

13. The circuit of claim 1, wherein the first excitation circuit is configured to provide an excitation current, which depends on a voltage across the first resonant circuit, to the first resonant circuit as determined by a first control signal supplied to the excitation circuit.

14. The circuit of claim 13, wherein the excitation current has one of a first signal level or a second signal level depending on the voltage across the first resonant circuit.

15. The circuit of claim 2, wherein the at least one further excitation circuit is configured to provide an excitation current, which is dependent on a voltage across the second resonant circuit, to the second resonant circuit as determined by a third control signal supplied to the at least one further excitation circuit.

16. The circuit of claim 15, wherein the excitation current assumes a first signal level or a second signal level in dependence on the voltage across the second resonant circuit.

17. The circuit of claim 2, wherein the second excitation circuit is configured to provide a first excitation current to the first resonant circuit as determined by a second control signal supplied to the excitation circuit and for feeding a second current, which is phase-shifted with respect to a first excitation current in the second resonant circuit.

18. The circuit of claim 17, wherein the first and second excitation currents are antiphase currents.

19. The circuit of claim 4, comprising a demodulation circuit operably connected to the secondary windings of the first and second transformers, the demodulation circuit including:
a differentiating unit operably coupled to the first and second secondary windings, and configured to generate a difference signal,
a summation unit operably coupled to the first and second secondary windings and configured to generate a sum signal,
a phase-shifting unit configured to receive the sum signal and to provide a phase-shifted sum signal,
at least one mixer configured to receive the difference signal and, using a signal dependent on the phase-shifted sum signal, to provide a mixer output signal,
an evaluating unit configured to receive the mixer output signal and to generate at least one demodulation signal in dependence on a comparison of the mixer output signal with at least one threshold value.

20. The circuit of claim 19, wherein the evaluating unit comprises:
a first threshold detector comparing the mixer output signal with a first threshold value and providing a first demodulation signal,
a second threshold detector comparing the mixer output signal with a second threshold value and providing a second demodulation signal.

21. The circuit of claim 20, wherein the evaluating unit is supplied with the difference signal and wherein the evaluating unit is configured to generate a third demodulation signal in dependence on the difference signal and the first and second demodulation signal.

22. The circuit of claim 19, wherein the demodulation circuit comprises:
a first mixer and a first threshold detector downstream of the first mixer, the first mixer receiving a signal that is dependent on the phase-shifted sum signal and that is dependent on the difference signal, and receiving a first demodulation signal available at an output of the first threshold detector,
a second mixer and a second threshold detector downstream the second mixer, the second mixer receiving a signal dependent on the phase-shifted sum signal and dependent on the difference signal, and receiving a second demodulation signal available at an output of the second threshold detector.

23. A signal transmitting method for transmitting at least two different transmit symbols comprising:
providing a transmitter comprising a first resonant circuit having a resonant circuit inductance and a resonant circuit capacitance and having a first inductive element coupled to the resonant circuit capacitance, and comprising a second resonant circuit having a resonant circuit inductance and a resonant circuit capacitance and having a second inductive element coupled to the resonant circuit capacitance,
exciting the first resonant circuit and the second resonant circuit into phase-shifted oscillations with a phase shift not equal to zero, which is different for each of the at least two different transmit symbols,
evaluating a phase relation of signals obtainable at the secondary windings of the transformers.

24. The signal transmitting method of claim 23, wherein transmitting a two-valued data sequence with first and second data symbols comprises the method steps of:
transmitting a first transmit symbol for a first data symbol of the data sequence,
transmitting a second transmit symbol for a second data symbol of the data sequence,
alternately transmitting the first transmit symbol and a third transmit symbol for at least two successive first data symbols of the data sequence, and
alternately transmitting the second transmit symbol and the third transmit symbol for at least two successive second data symbols of the data sequence.

25. The signal transmitting method of claim 23, wherein for transmitting n two-valued data sequences assuming a first or second data value, with $n \geq 2$, a transmit symbol sequence with n successive transmit symbols is transmitted, of which each transmit symbol represents the data value of a data sequence.

* * * * *